US008772165B2

(12) United States Patent
Kim et al.

(10) Patent No.: US 8,772,165 B2
(45) Date of Patent: Jul. 8, 2014

(54) METHODS OF MANUFACTURING GATES FOR PREVENTING SHORTS BETWEEN THE GATES AND SELF-ALIGNED CONTACTS AND SEMICONDUCTOR DEVICES HAVING THE SAME

(75) Inventors: Ju Youn Kim, Suwon-si (KR); Jedon Kim, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 159 days.

(21) Appl. No.: 13/182,614

(22) Filed: Jul. 14, 2011

(65) Prior Publication Data
US 2013/0015532 A1   Jan. 17, 2013

(51) Int. Cl.
*H01L 21/461*   (2006.01)
*H01L 29/66*   (2006.01)

(52) U.S. Cl.
CPC ................................. *H01L 29/66545* (2013.01)
USPC .......................................................... 438/692

(58) Field of Classification Search
CPC .................................................. H01L 29/66545
USPC .................. 257/380, 379, E29.041, E21.071; 438/171, 210, 183, 692
See application file for complete search history.

(56) References Cited

U.S. PATENT DOCUMENTS

| | | | | |
|---|---|---|---|---|
| 6,251,729 | B1* | 6/2001 | Montree et al. | 438/257 |
| 6,911,381 | B2* | 6/2005 | Agarwal et al. | 438/532 |
| 7,419,898 | B2* | 9/2008 | Liaw | 438/618 |
| 2010/0270627 | A1* | 10/2010 | Chang et al. | 257/411 |
| 2011/0171810 | A1* | 7/2011 | Tseng et al. | 438/382 |
| 2012/0139053 | A1* | 6/2012 | Ando et al. | 257/369 |
| 2012/0161237 | A1* | 6/2012 | Jan et al. | 257/368 |

* cited by examiner

*Primary Examiner* — William D Coleman
(74) *Attorney, Agent, or Firm* — F. Chau & Associates, LLC

(57) ABSTRACT

A method for manufacturing a semiconductor device, comprising forming a metal gate of a transistor on a substrate by a replacement metal gate process, wherein an insulating layer is formed on the substrate adjacent the metal gate, forming a hard mask on the substrate including the insulating layer and the metal gate, the hard mask including an opening exposing the metal gate, performing a metal pull back process on the substrate to remove a predetermined depth of a top portion of the metal gate, depositing a protective layer on the substrate, including on the hard mask and on top of a remaining portion of the metal gate, and performing chemical mechanical polishing to remove the hard mask and the protective layer, wherein the protective layer formed on top of the remaining portion of the metal gate remains.

24 Claims, 30 Drawing Sheets

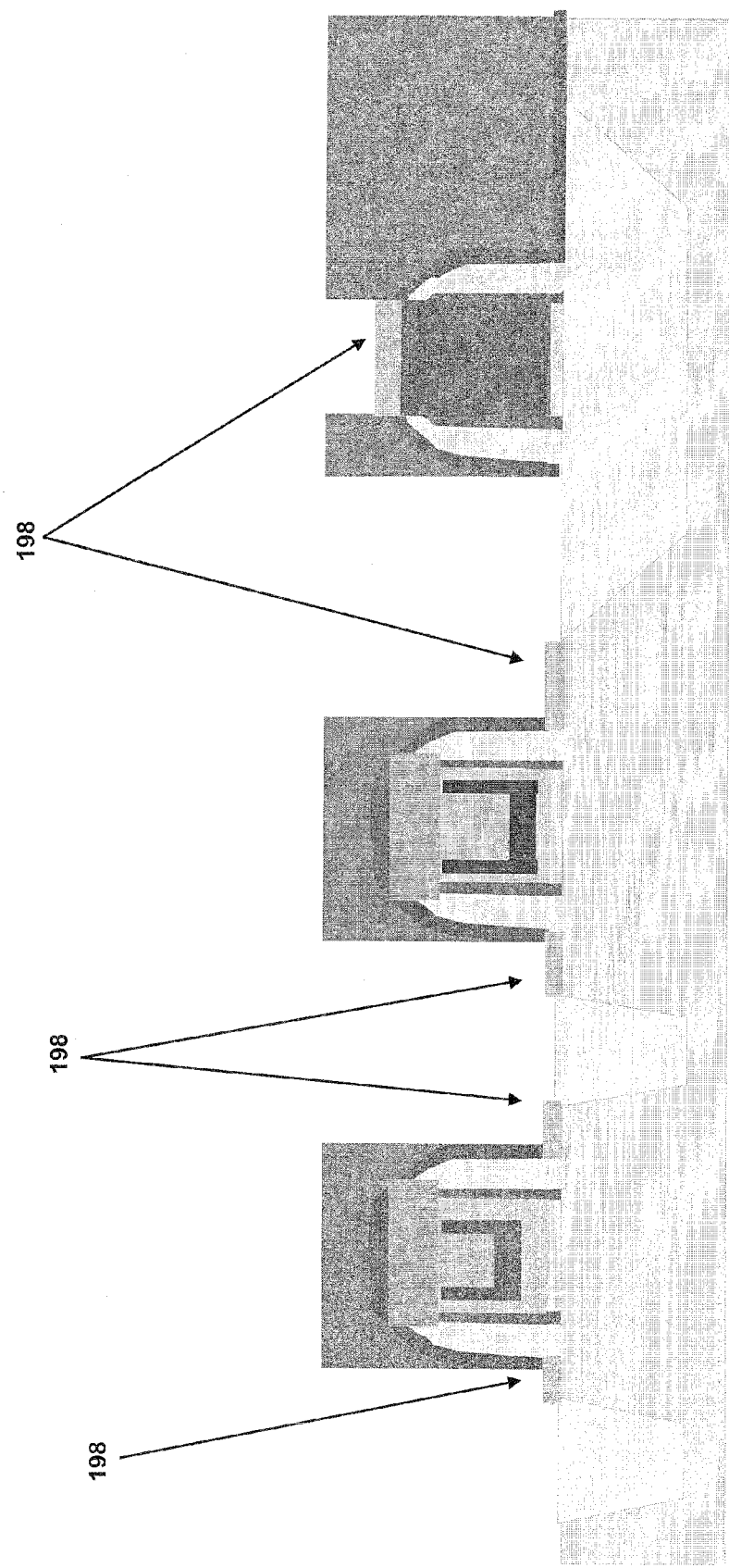

METHODS OF MANUFACTURING GATES FOR PREVENTING SHORTS BETWEEN THE GATES AND SELF-ALIGNED CONTACTS AND SEMICONDUCTOR DEVICES HAVING THE SAME

BACKGROUND

1. Technical Field

The present disclosure relates to methods of manufacturing gates so as to prevent shorts between metal gates and contacts, and semiconductor devices having the same. The methods are compatible with and can be performed in conjunction with methods of forming a polysilicon resistor during a replacement metal gate process.

2. Discussion of the Related Art

Semiconductor devices, such as, for example, transistors, resistors, capacitors, and the like, can be accessed by one or more contacts to the devices. However, as circuit density increases, the risk of shorting between a gate and a contact, such as an interconnect to a source or drain, increases. In addition, a protective or blocking layer on a gate, such as a nitride layer, may be removed during a process, such as a light process, during which the metal forming the contact, such as a self-aligned contact (SAC), is deposited. As a result, a short between the metal gate and the SAC may occur.

Contact to gate shorting creates a short circuit in the semiconductor device that degrades the function of semiconductor device, resulting in, for example, yield loss. A short between a contact opening filled with metallic material and a gate may result in the loss of an entire chip.

In addition, certain sections of the metal gate formed of a first metal may include a blocking layer, while others, formed of second metal, are left exposed to cause shorting. For example, a center section of a metal gate may include a blocking layer, such as an oxide, while end portions of the metal gate are not under a blocking layer, leaving the end portions vulnerable to shorting due to contact with the metal forming the interconnect.

Accordingly, there exists a need for a process that results in a semiconductor device in which metal gates are sufficiently protected from contacting interconnects, such as SACs, thereby preventing unwanted shorts.

In addition, there also exists a need for a process and a structure which prevents the above-described shorting, and is also compatible with a replacement metal gate (RMG) process, wherein disposable polysilicon gates are replaced by metal gates having lower resistivity than the polysilicon material, and polysilicon remains in the portions of a substrate forming the resistors.

SUMMARY

A method for manufacturing a semiconductor device, according to an embodiment of the present inventive concept, comprises forming a metal gate of a transistor on a substrate by a replacement metal gate process, wherein an insulating layer is formed on the substrate adjacent the metal gate, forming a hard mask on the substrate including the insulating layer and the metal gate, the hard mask including an opening exposing the metal gate, performing a metal pull back process on the substrate to remove a predetermined depth of a top portion of the metal gate, depositing a protective layer on the substrate, including on the hard mask and on top of a remaining portion of the metal gate, and performing chemical mechanical polishing to remove the hard mask and the protective layer, wherein the protective layer formed on top of the remaining portion of the metal gate remains.

The predetermined depth may be approximately 100 angstroms. The protective layer may include silicon nitride.

The method may further comprise removing the insulating layer, depositing a first dielectric layer on exposed portions of the substrate, including the protective layer formed on top of the remaining portion of the metal gate, depositing a second dielectric layer on the structure including the first dielectric layer, performing an open mask process to remove the first and second dielectric layers from areas adjacent the metal gate, and forming silicide layers on portions of the substrate where the first and second dielectric layers were removed.

The method may also further comprise depositing a third dielectric layer on the metal gate and on the silicide layers, etching the third dielectric layer over a silicide layer to form a via, and filling the via with a metal to form an interconnect, wherein a portion of the metal fills a vacant area on the protective layer, disposing the protective layer between the metal gate and the metal in the via, the protective layer blocking the metal in the via from contacting the metal gate.

The metal filling the via may comprises tungsten. The third dielectric layer may comprise at least one of tetraethoxysilane (TEOS) and undoped silicate glass (USG).

A chemical mechanical polishing process may be performed on the insulating layer and the metal gate prior to forming the hard mask.

The metal gate may include an outer layer comprising a different metal than that of an inner layer, the protective layer covering each of the inner and outer layers.

A method for manufacturing a semiconductor device, according to an embodiment of the present inventive concept, comprises forming a metal gate of a transistor on a substrate by a replacement metal gate process, wherein an insulating layer is formed on the substrate adjacent the metal gate, depositing a protective layer on the substrate covering the insulating layer and a top surface of the metal gate, and patterning the protective layer to remove the protective layer from the insulating layer adjacent the metal gate, wherein the protective layer remains covering the top surface of the metal gate.

A thickness of the protective layer may be about 50 angstroms to about 100 angstroms.

The method may further comprise depositing a first dielectric layer on exposed portions of the substrate, including the protective layer covering the top surface of the metal gate.

A chemical mechanical polishing process may be performed on the insulating layer and the metal gate prior to depositing the protective layer.

A semiconductor device, according to an embodiment of the present inventive concept, comprises a substrate, a transistor including a metal gate on the substrate, the metal gate including a protective layer on a top surface of the metal gate, a polysilicon resistor on the substrate adjacent the transistor, an interconnect contacting one of a drain or source region of the transistor, wherein part of the interconnect is formed over the top surface of the metal gate, and the protective layer is formed between the top surface of the metal gate and the part of the interconnect formed over the top surface of the metal gate, the protective layer blocking the interconnect from contacting the top surface of the metal gate.

The interconnect may comprise tungsten and may be a self-aligned contact.

A computer system, according to an embodiment of the present inventive concept, may comprise the above semiconductor device, wherein the computer system is one of a personal computer (PC), a personal digital assistant (PDA), an MP3 player, a digital audio recorder, a pen-shaped computer, a digital camera, or a video recorder.

A system for transmitting or receiving data, according to an embodiment of the inventive concept, comprises a memory device for storing a program, and a processor in communication with the memory device, wherein the memory device comprises a substrate, a transistor including a metal gate on the substrate, the metal gate including a protective layer on a top surface of the metal gate, a polysilicon resistor on the substrate adjacent the transistor, an interconnect contacting one of a drain or source region of the transistor, wherein part of the interconnect is formed over the top surface of the metal gate, and the protective layer is formed between the top surface of the metal gate and the part of the interconnect formed over the top surface of the metal gate, the protective layer blocking the interconnect from contacting the top surface of the metal gate.

The system may comprise at least one of a mobile system, a portable computer, a web tablet, a mobile phone, a digital music player, or a memory card.

A semiconductor memory card, according to an embodiment of the present inventive concept, comprises an interface part that interfaces with an external device, a controller that communicates with the interface part and a memory device via address and data buses, wherein the memory device comprises a substrate, a transistor including a metal gate on the substrate, the metal gate including a protective layer on a top surface of the metal gate, a polysilicon resistor on the substrate adjacent the transistor, an interconnect contacting one of a drain or source region of the transistor, wherein part of the interconnect is formed over the top surface of the metal gate, and the protective layer is formed between the top surface of the metal gate and the part of the interconnect formed over the top surface of the metal gate, the protective layer blocking the interconnect from contacting the top surface of the metal gate.

A computer system, according to an embodiment of the inventive concept, comprises a semiconductor device having a circuit layout manufactured by any of the above methods, wherein the computer system is one of a personal computer (PC), a personal digital assistant (PDA), an MP3 player, a digital audio recorder, a pen-shaped computer, a digital camera, or a video recorder.

A system for transmitting or receiving data, according to an embodiment of the inventive concept, comprises a memory device for storing a program, and a processor in communication with the memory device, wherein the memory device comprises a circuit layout manufactured by any of the above methods. The system may comprise at least one of a mobile system, a portable computer, a web tablet, a mobile phone, a digital music player, or a memory card.

A semiconductor memory card, according to an embodiment of the present inventive concept, comprises an interface part that interfaces with an external device, a controller that communicates with the interface part and a memory device via address and data buses, wherein the memory device comprises a circuit layout manufactured by any of the above methods.

BRIEF DESCRIPTION OF THE DRAWINGS

Exemplary embodiments of the present inventive concept will be described below in more detail, with reference to the accompanying drawings, of which:

FIGS. 1-18, 19A, 19B, 20A, 20B, 21A, 21B, 22A, 22B and 23 are cross-sectional views of a semiconductor substrate for illustrating methods of manufacturing metal gates for preventing a short between the gates and contacts, a replacement metal gate process, and a resulting semiconductor device, according to embodiments of the present inventive concept;

DETAILED DESCRIPTION OF THE EMBODIMENTS

Exemplary embodiments of the present inventive concept now will be described more fully hereinafter with reference to the accompanying drawings. This inventive concept may, however, be embodied in many different forms and should not be construed as limited to the embodiments set forth herein.

Figure 1:
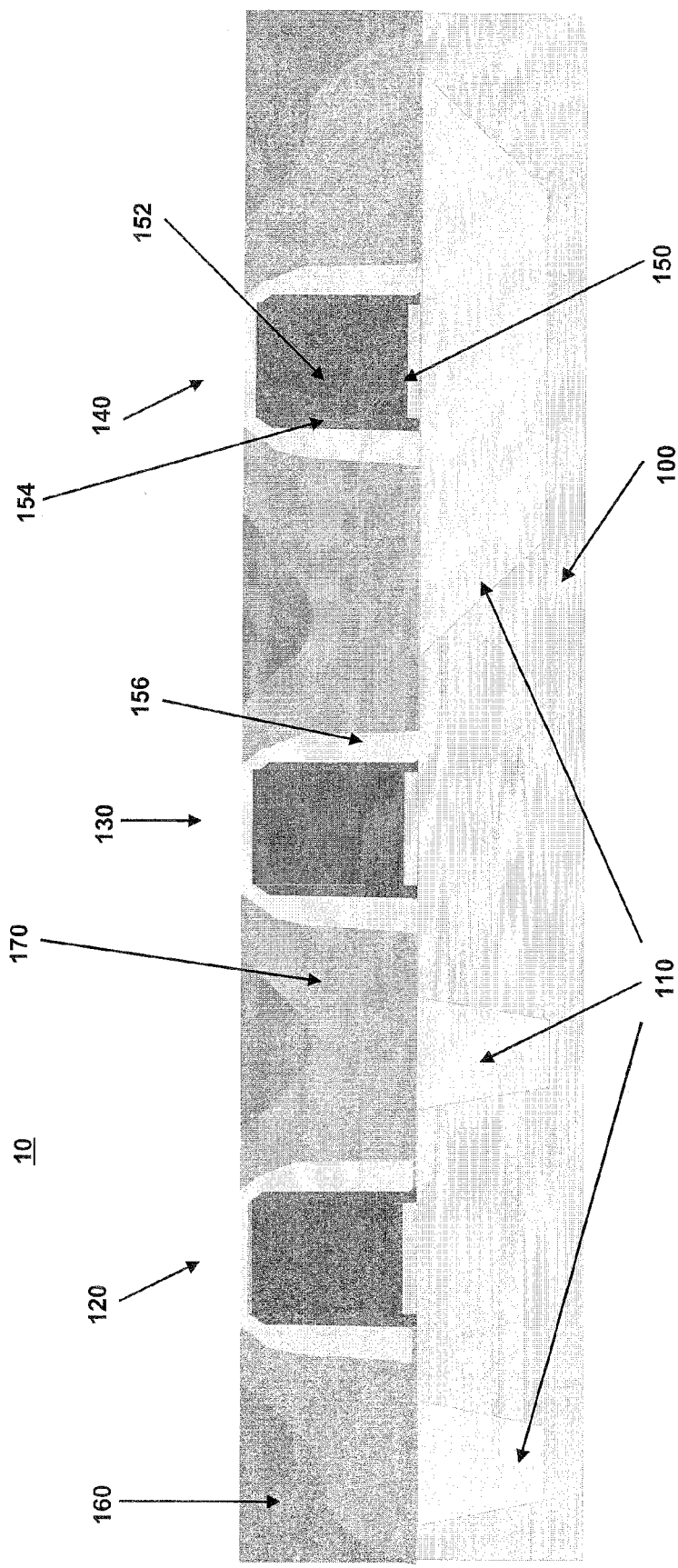

Referring to FIG. 1, according to an embodiment of the present inventive concept, a semiconductor device 10 includes a substrate 100 including a plurality of shallow trench isolation (STI) regions 110. On the substrate 100 are formed a first single gate (SG) field-effect transistor (FET) 120, a second SG FET 130, and a resistor structure 140. According to an embodiment of the present inventive concept, the first SG FET 120 is an NFET, the second SG FET 130 is a PFET, and the resistor structure 140 includes a P+ poly resistor. Alternatively, the doping can be reversed, and the first SG FET 120 can be a PFET, the second SG FET 130 can be an NFET, and the resistor can be an N+ poly resistor. As can be seen, the area of the STI region 110 under the resistor structure 140 is larger than those of the remaining STI regions 110 between and adjacent the FETs.

A combination of a stress liner 160, including, for example, silicon nitride (SiN), and a dielectric 170, such as undoped silicate glass (USG) or silicon dioxide ($SiO_2$) are deposited on the substrate, and fill in the areas between and adjacent the FETs 120, 130 and the resistor structure 140. The resulting structure shown in FIG. 1 is formed after chemical mechanical polishing (CMP), which planarizes the top surface.

As can be seen in FIG. 1, the FETs 120, 130 and the resistor structure 140 each include a gate oxide layer 150, polysilicon 152 formed on the gate oxide layer 150, and sidewall spacers 154, 156 formed on the sides of the polysilicon 152. The number and thickness of the sidewall spacers 154, 156 can vary depending on design constraints, and is not limited to what is shown in FIG. 1. For example, the number of sidewall spacers can be more or less than 2, and the thickness of the sidewall spacer(s) can vary. According to an embodiment, SiN can be used as a material for at least one pair of sidewall spacers.

Figure 2:
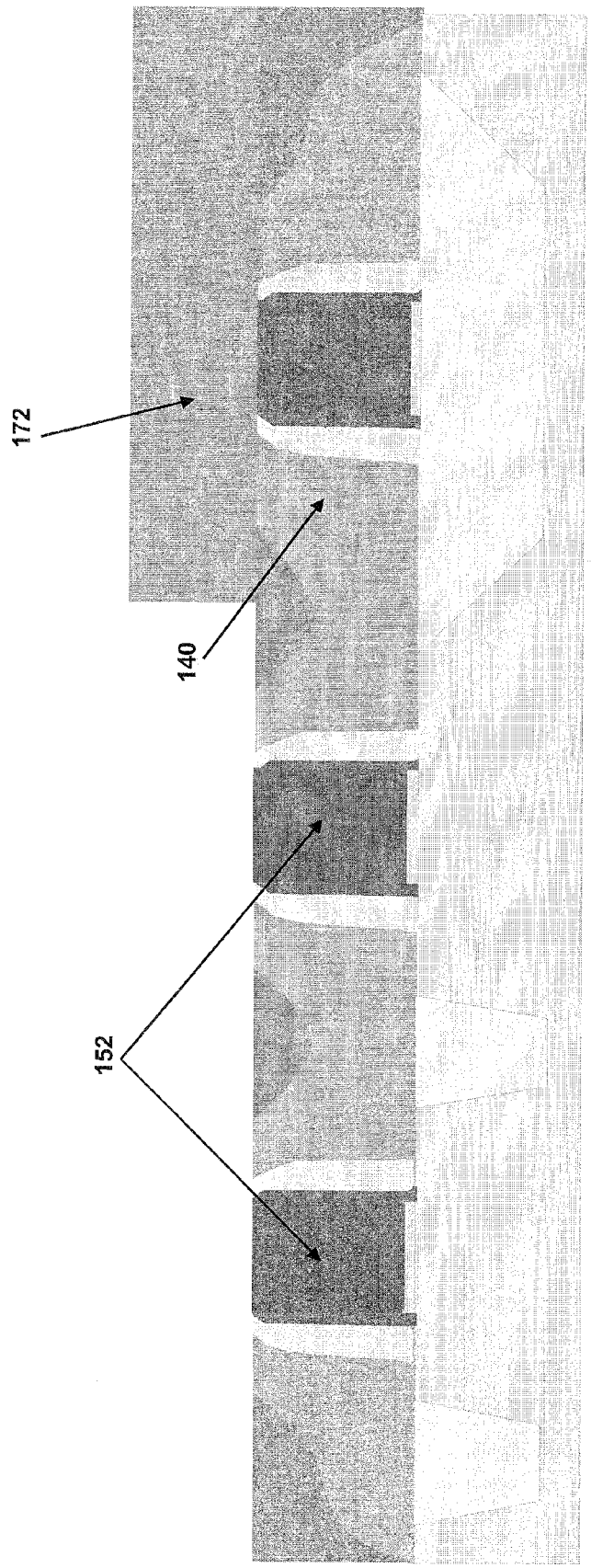

Referring to FIG. 2, prior to a process for removing the polysilicon 152, a photoresist 172 is formed over an area of the substrate 100 including the resistor structure 140 so as to prevent removal of the polysilicon 152 from the area that will form the resistor. After placement of the photoresist 172, an etching process is performed to remove the polysilicon 152 from the FETs 120 and 130. The etch process may be, for example, a wet etch process using, for example, ammonia, tetramethyl ammonium hydroxide (TMAH), and/or tetraethylammonium hydroxide (TEAH).

Figure 3:
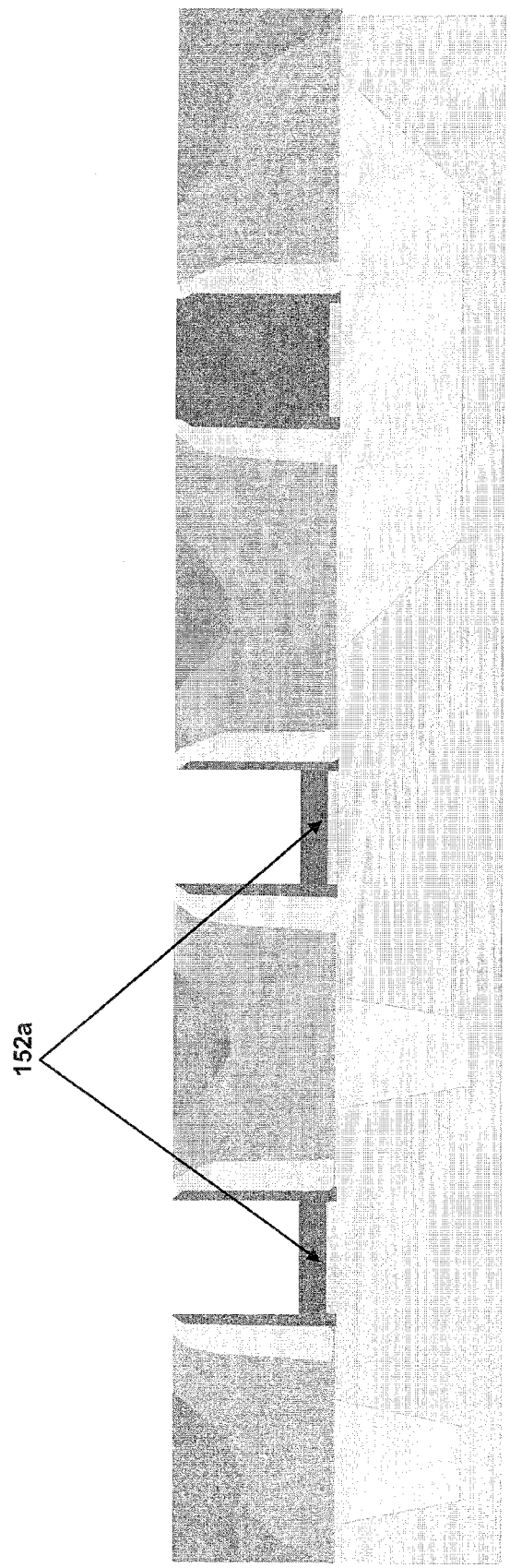
Figure 4:
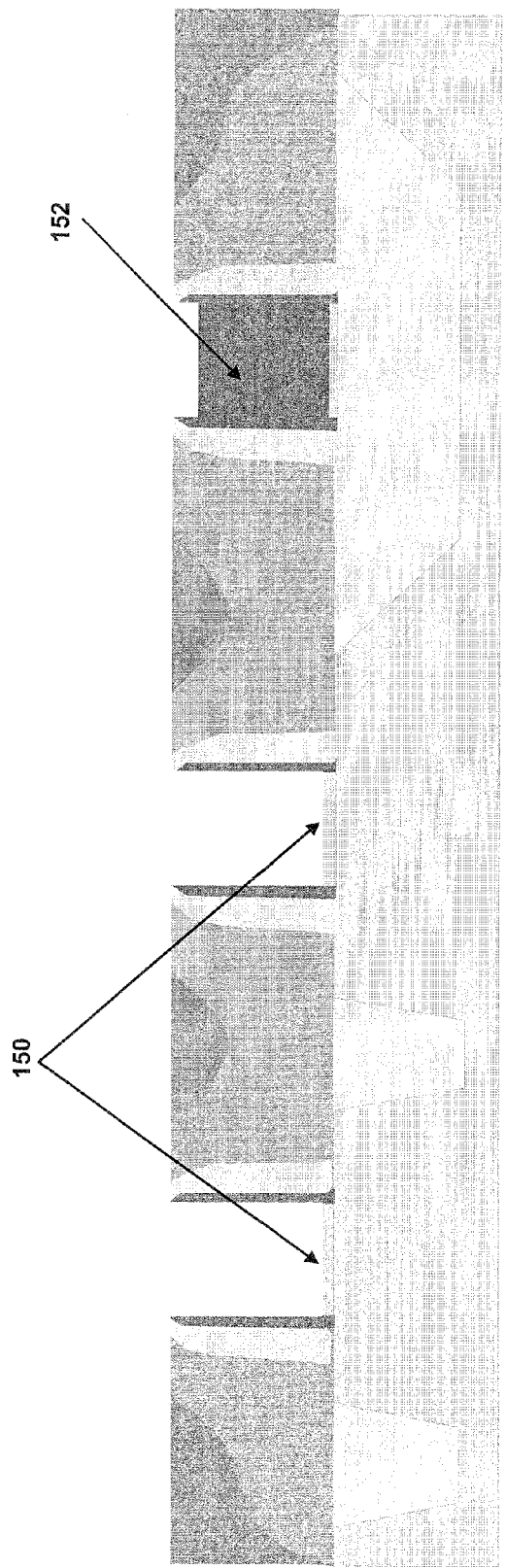

Referring to FIG. 3, an upper portion of the polysilicon material 152 is removed from the FETs 120, 130 using, for example, a light stream wet etch process. A lower portion 152a of the polysilicon remains after the upper portion is removed. The photoresist 172 is removed after the etch. Referring to FIG. 4, an ashing process, using, for example, $H_2N_2$, is used to remove the remaining portion 152*a* of the polysilicon. In addition, some of the polysilicon 152 in the resistor structure 140 is removed during the ashing process. A two-step polysilicon removal process allows the time for the light stream wet etch process to be reduced so as to prevent the height of the FETs 120, 130 from being overly reduced during the light stream wet etch process. Further, a two-step polysilicon removal process prevents residue from the photoresist 172 from forming in the area where the poly resistor is formed.

Figure 5:
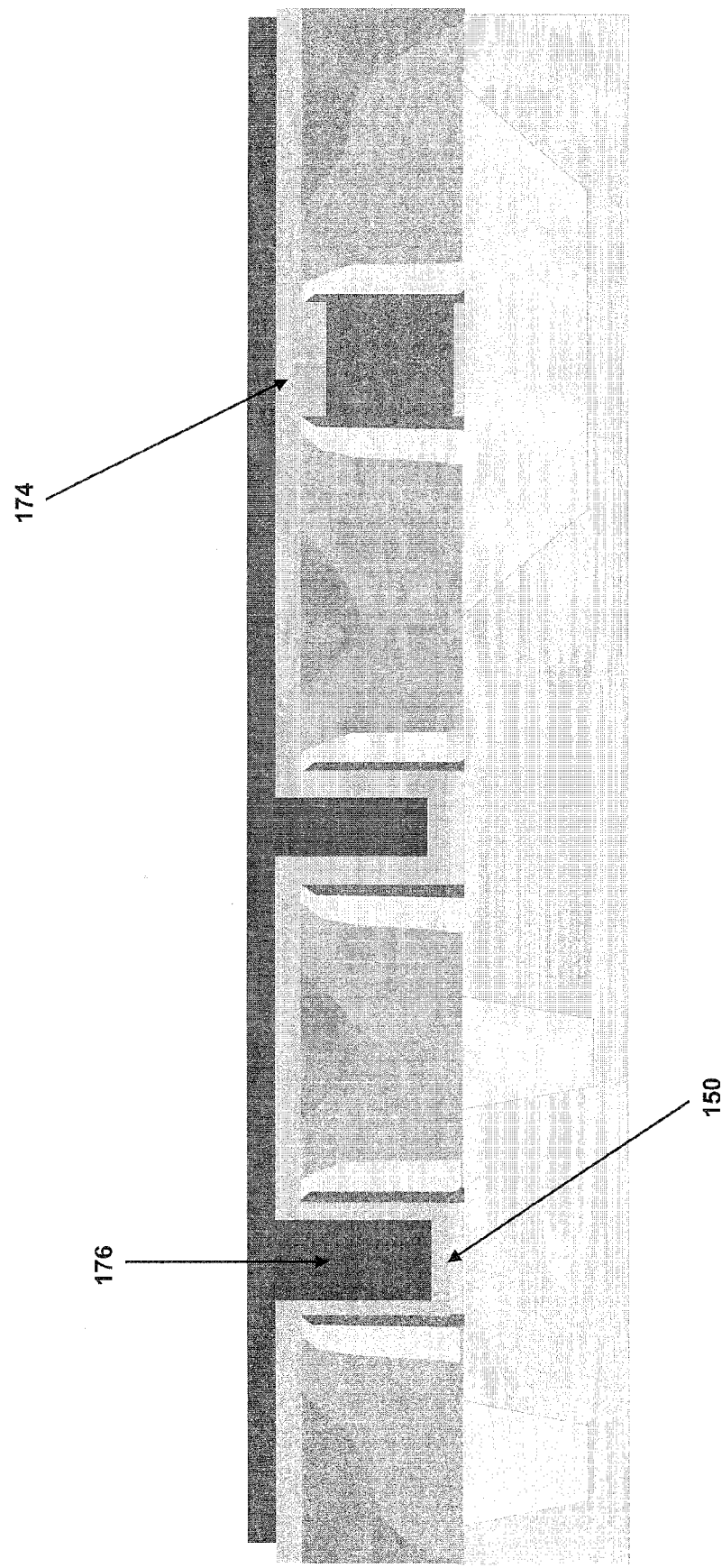

Referring to FIG. 5, a high-K dielectric material 174 having a high dielectric constant κ when compared with that of silicon dioxide such as, for example, hafnium silicate, zirconium silicate, hafnium dioxide and/or zirconium dioxide, is deposited on the structure shown in FIG. 4 using, for example, chemical vapor deposition, atomic layer deposition or molecular layer deposition. After deposition of the high-K dielectric 174, a first metal 176, comprising, for example, a three-layer structure of a bottom layer of TiN, a middle layer of TaN and a top layer of TiN, is deposited on the high-K layer 174. The first metal 176 is not limited to this structure, and may include different materials in different layer configurations.

Figure 6:
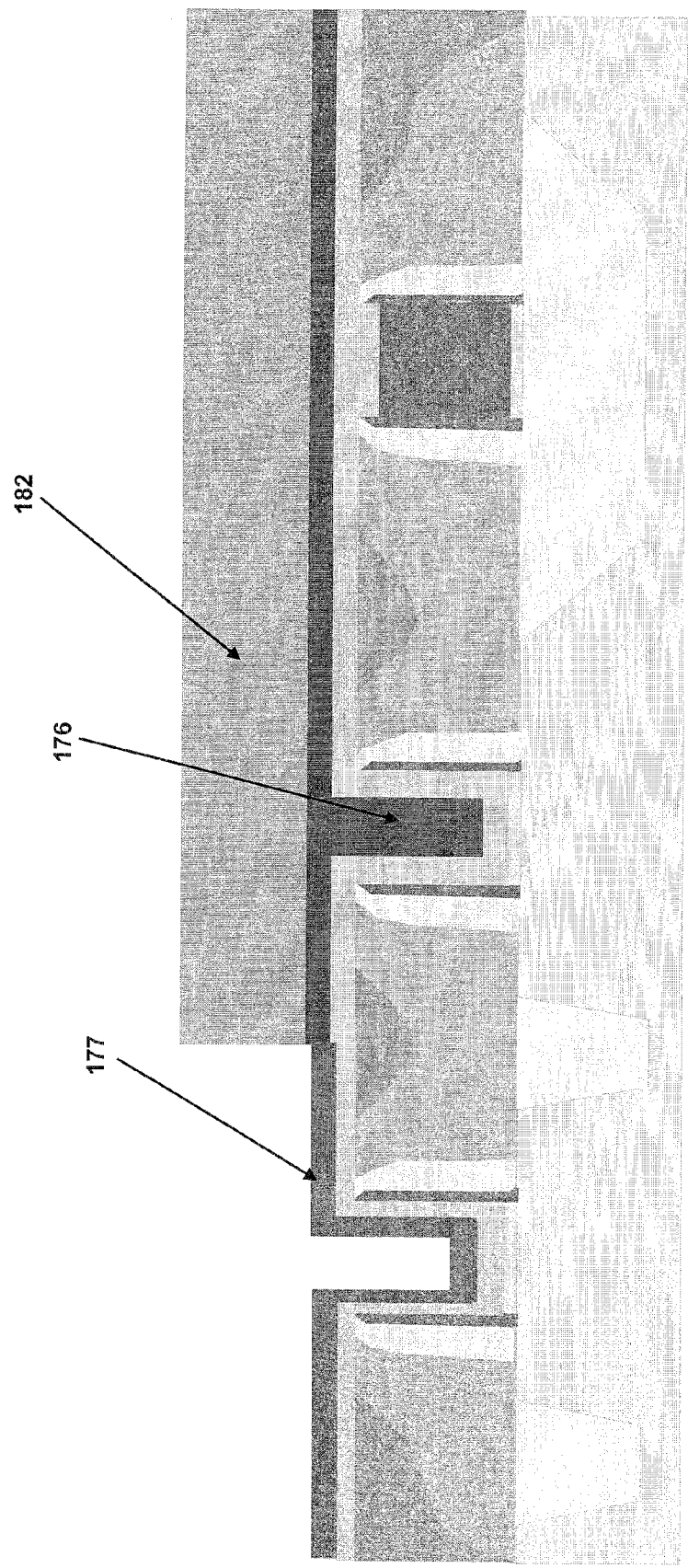

Referring to FIG. 6, in connection with an embodiment where the first metal 176 includes the above-referenced three-layer structure, the top TiN layer is removed from the SG NFET 120, and areas adjacent thereto to result in a two-layer structure 177 including a bottom layer of TiN and a top layer of TaN. A photoresist 182 made of, for example, an oxide or nitride, is used to cover the SG PFET 130, the resistor structure 140, and areas adjacent thereto so that the top TiN layer is not removed from the covered areas. Thereafter, referring to FIG. 7, after the photoresist 182 is removed, a second metal 178 including, for example, a three-layer structure of a bottom layer of TiAl, a middle layer of TiN, and a top layer of titanium and aluminum alloy (Ti/Al), is deposited on the remaining structure. As a result, according to an embodiment, the metal gate 121 (see FIG. 8) for the SG NFET 120 includes a 5-layer structure (from bottom to top) of: TiN—TaN—TiAl—TiN—Ti/Al, and the metal gate 131 (see FIG. 8) for the SG PFET 130 includes a 6-layer structure (from bottom to top) of: TiN—TaN—TiN—TiAl—TiN—Ti/Al. According to alternative embodiments, the metal gates may include different materials in different layer configurations.

Figure 7:
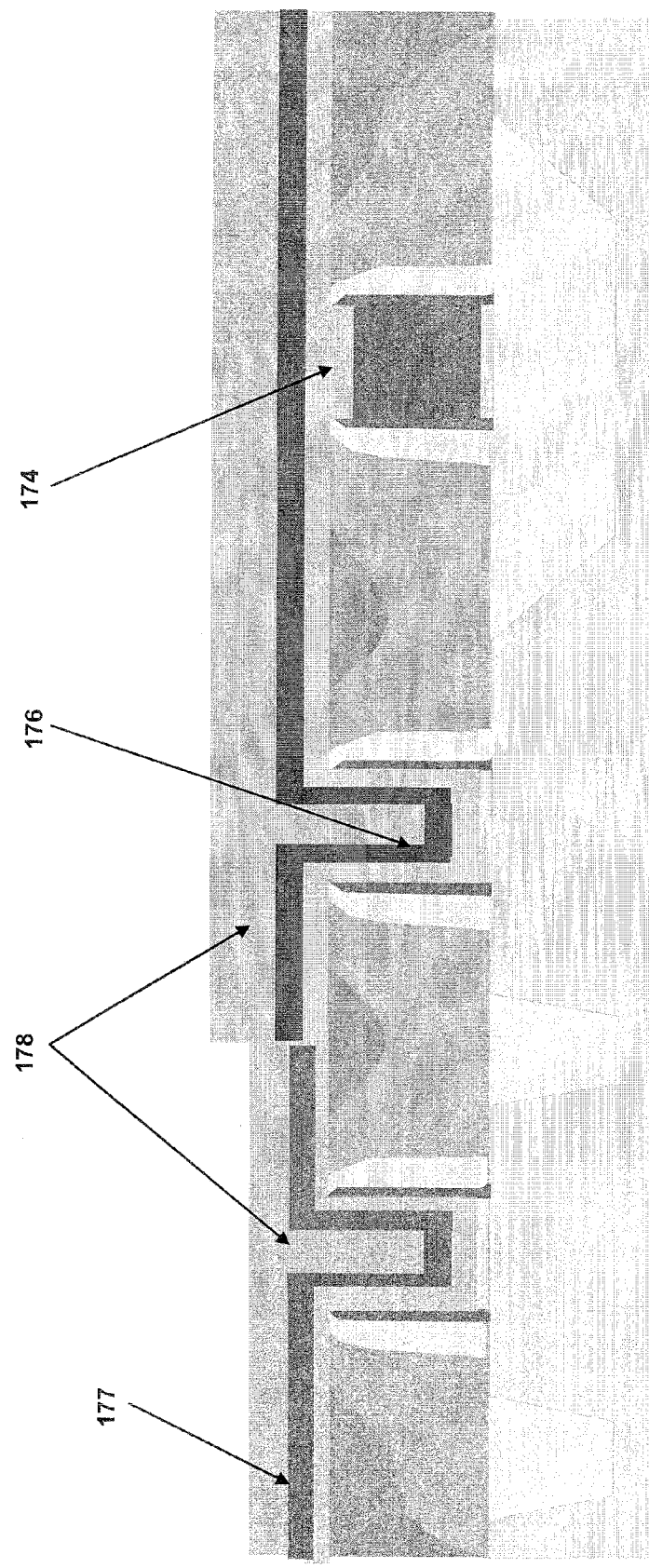
Figure 8:
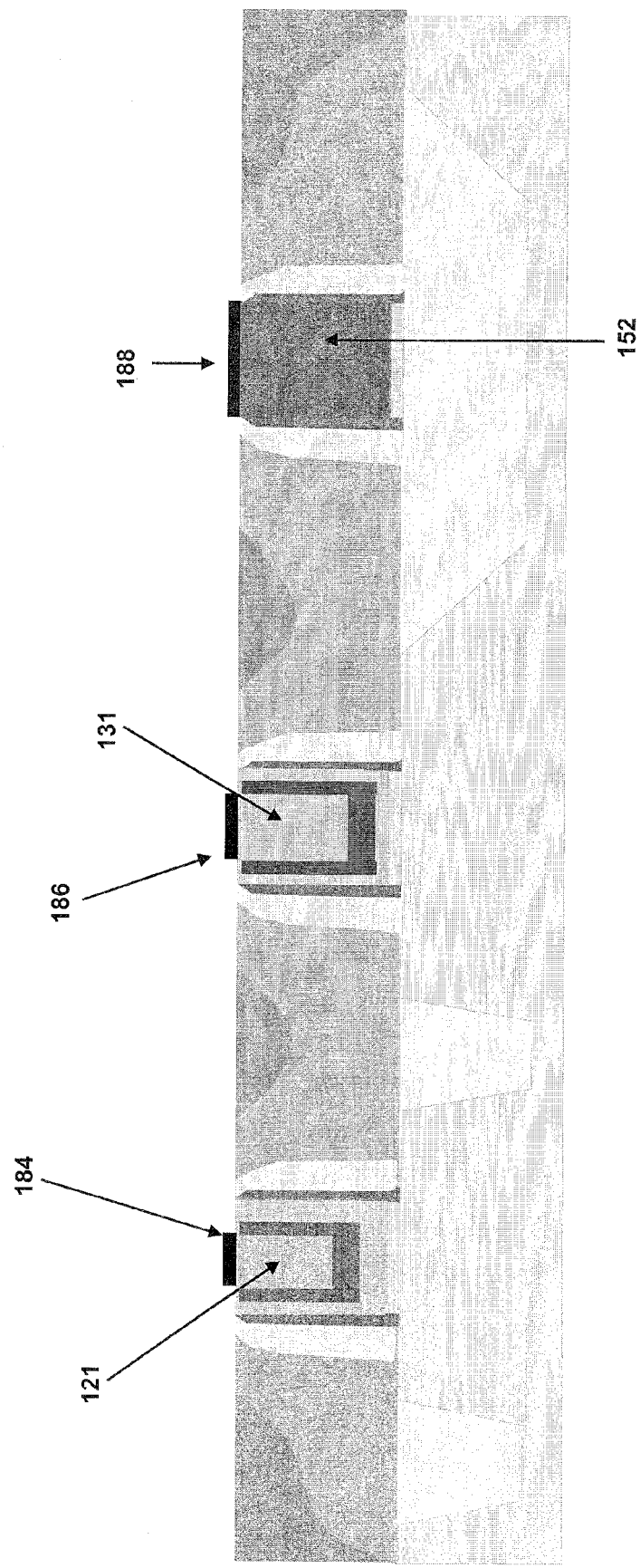

Referring now to FIG. 8, aluminum chemical mechanical polishing (Al CMP) is performed on the structure in FIG. 7. The Al CMP process is performed with a slurry to remove the high-K, and first and second metal layers 174, 176, 178 from a top surface of the substrate, and to planarize the top surface. As a result of the Al CMP process, the structure shown in FIG. 8 is formed, wherein the height of the FETs 120 and 130, and the resistor structure 140 is reduced. As can be seen, the height of the resistor structure 140 is reduced down to the polysilicon material 152. Oxidation during the CMP process results in metal oxides 184 and 186 being formed on top of the metal gates 121, 131 of each of the FETs 120 and 130, and a silicon oxide 188 formed on top of the polysilicon material 152, which forms the resistor of the resistor structure 140. According to an embodiment, a thickness of the metal oxides 184, 186 and the silicon oxide 188 is about 20 Å to about 30 Å.

Figure 9:
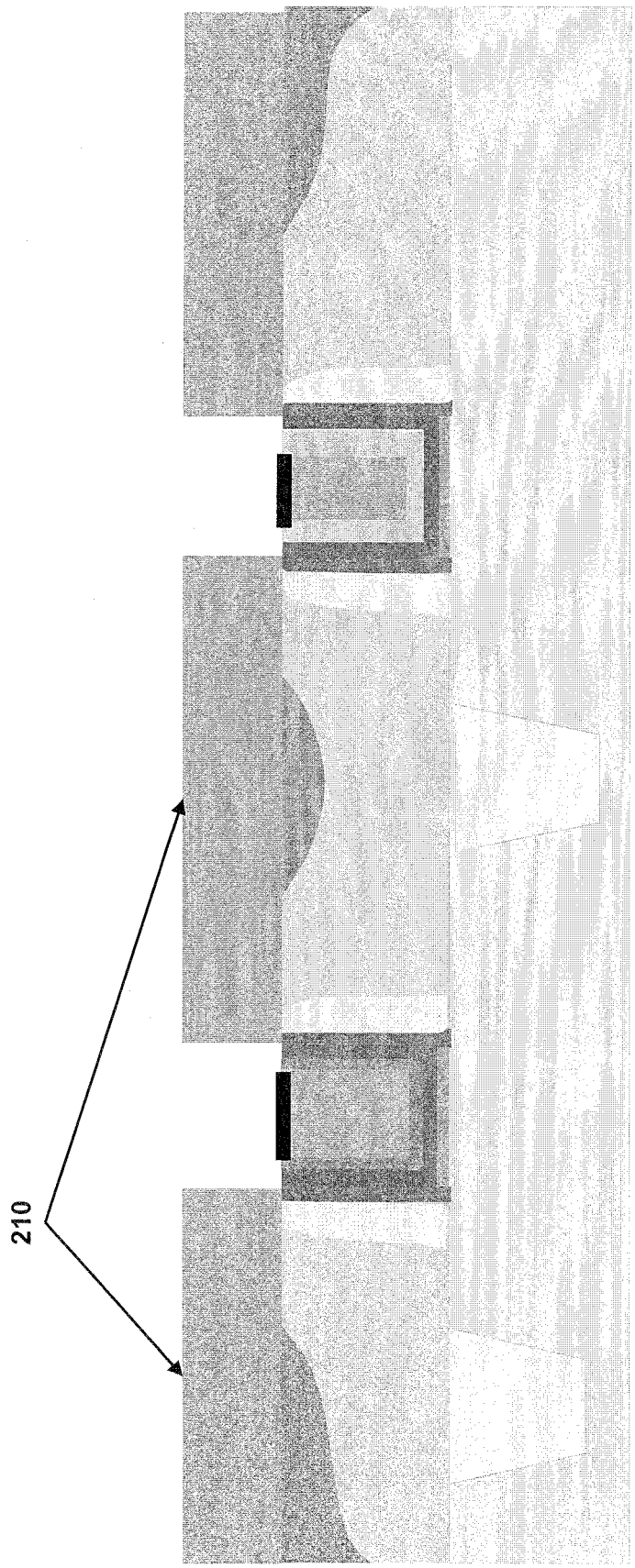
Figure 10:
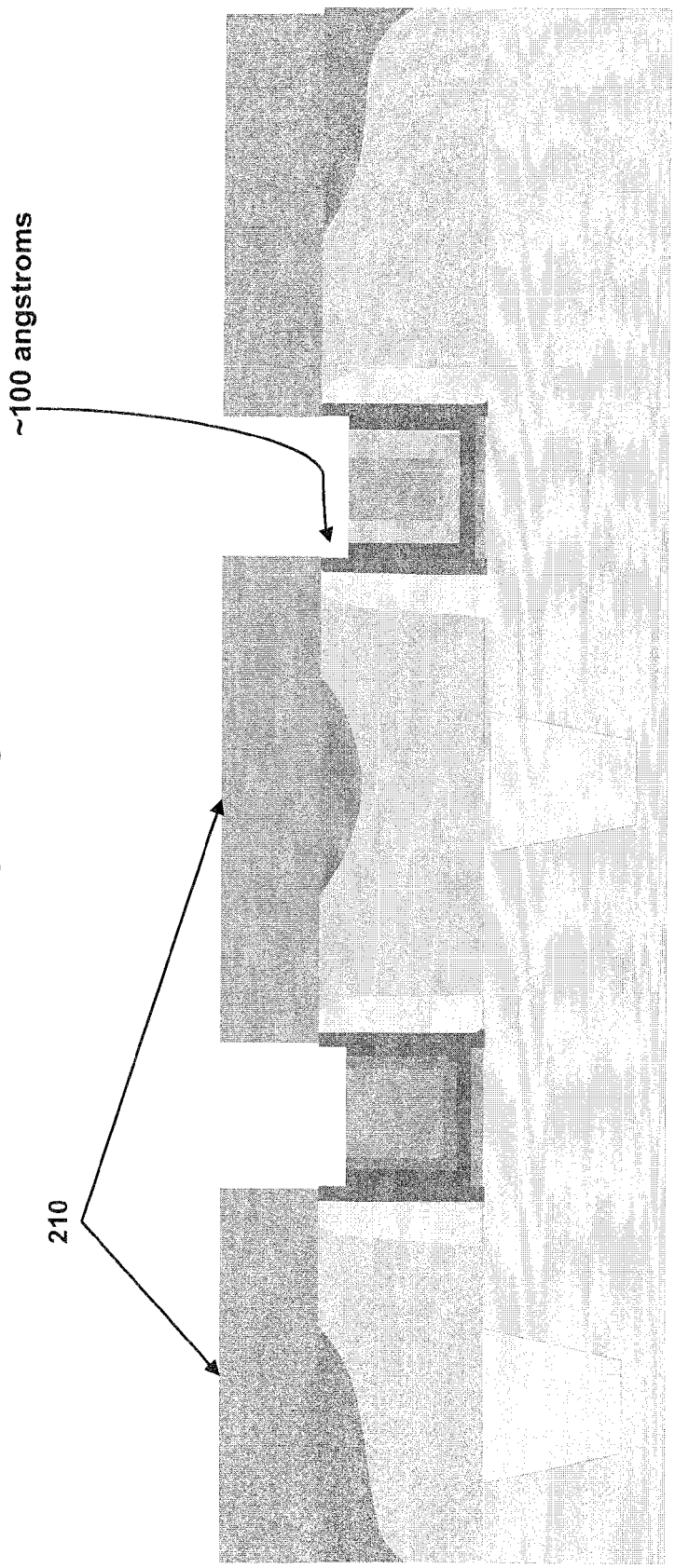

Referring to FIG. 9, a hard mask 210, formed of, for example, silicon nitride (SiN), is formed on the resulting structure, except for the metal gates 121, 131. Then, referring to FIG. 10, a metal pull back process is performed, wherein light etching is performed to remove a predetermined depth of the metal gates 121, 131. For example, approximately 100 angstroms of the metal gates 121, 131 are removed during the metal pull back process.

Figure 11:
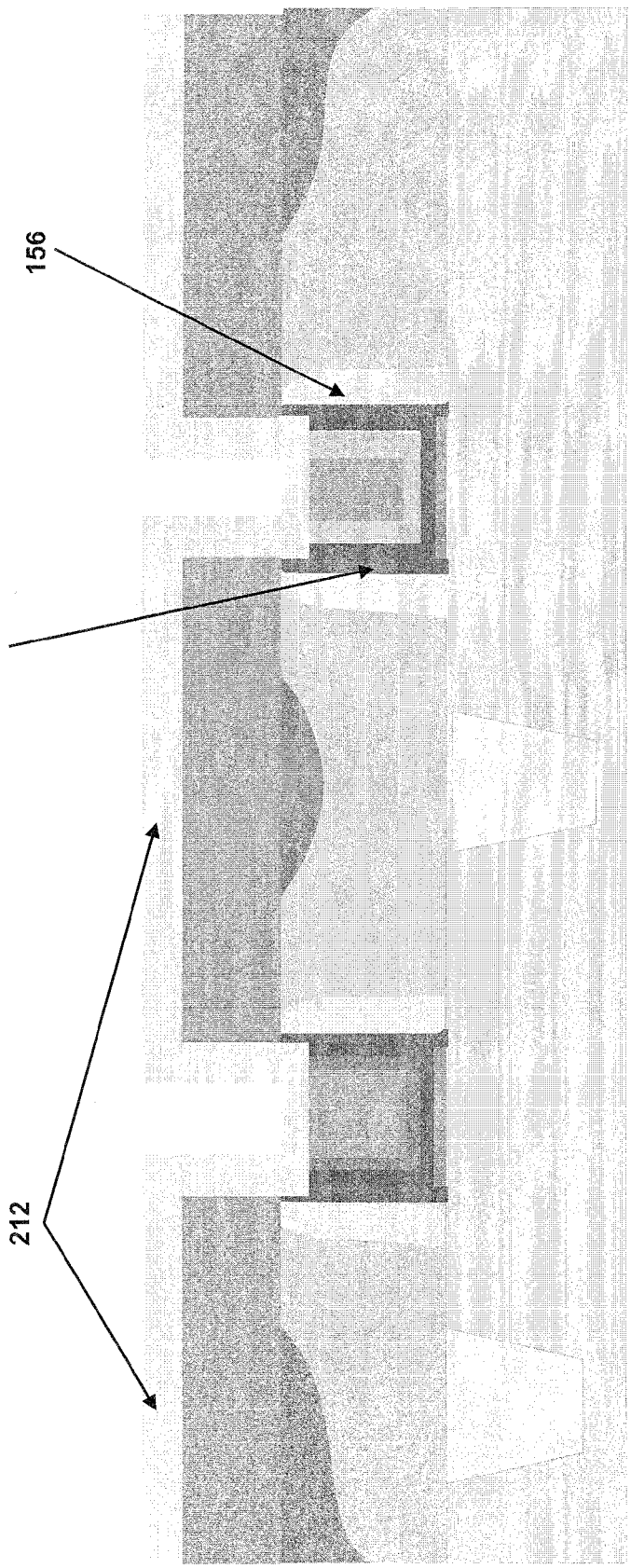
Figure 12:
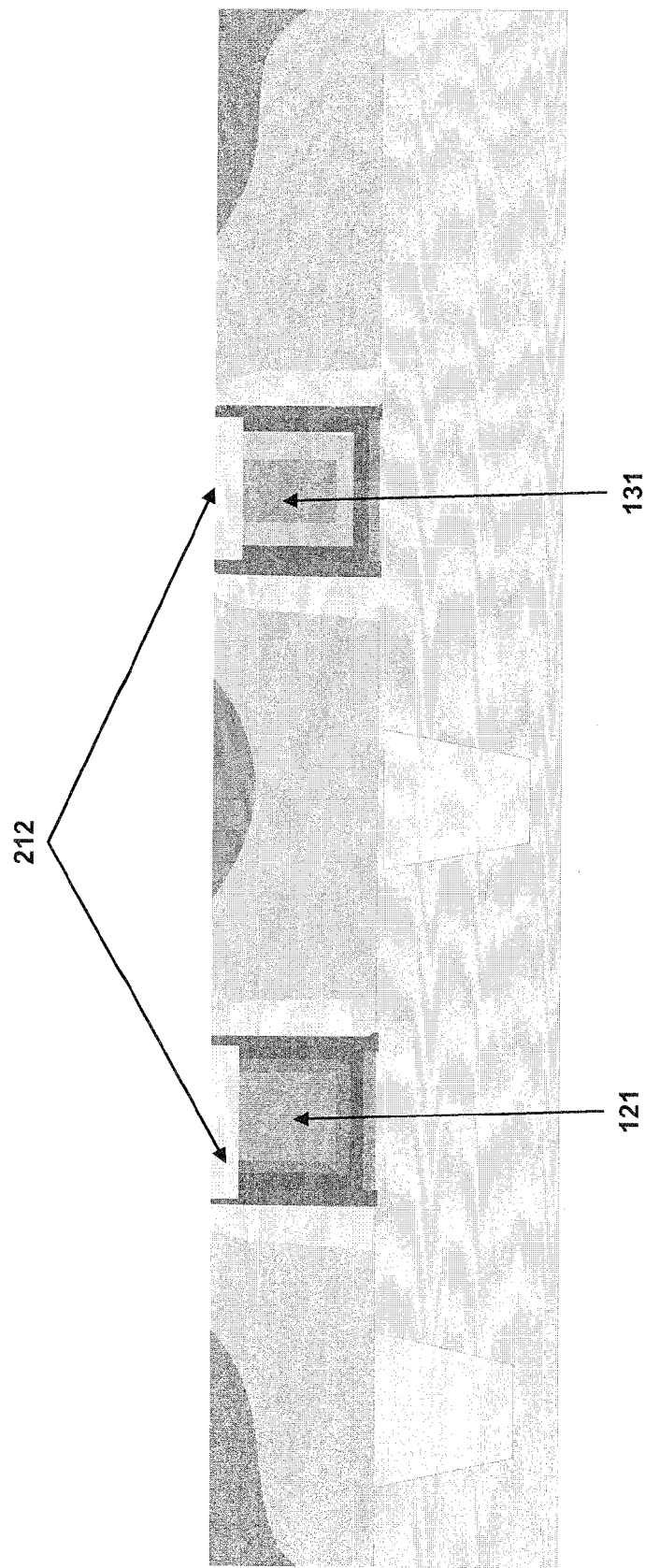

Referring to FIG. 11, after the metal pull back process, a protective layer 212, such as, for example, silicon nitride, is formed on the resulting structure, including the hard mask 210 and to fill in the portions of the gate structures between the spacers 154, 156, where part of the metal gates 121, 131 were removed. Then, referring to FIG. 12, a CMP process is performed to remove the protective layer 212 and the hard mask 210 from areas surrounding the metal gates 121, 131. The protective layer 212 remains on those portions of the metal gates 121, 131 where the protective layer 212 fills in the portions of the gate structure between the spacers 154, 156. As a result of the location of the protective layer 212, shorts between interconnects, such as SACs, and the metal gates 121, 131 can be prevented since the protective layer 212 blocks the interconnects from contacting the metal gates 121, 131.

Figure 13:
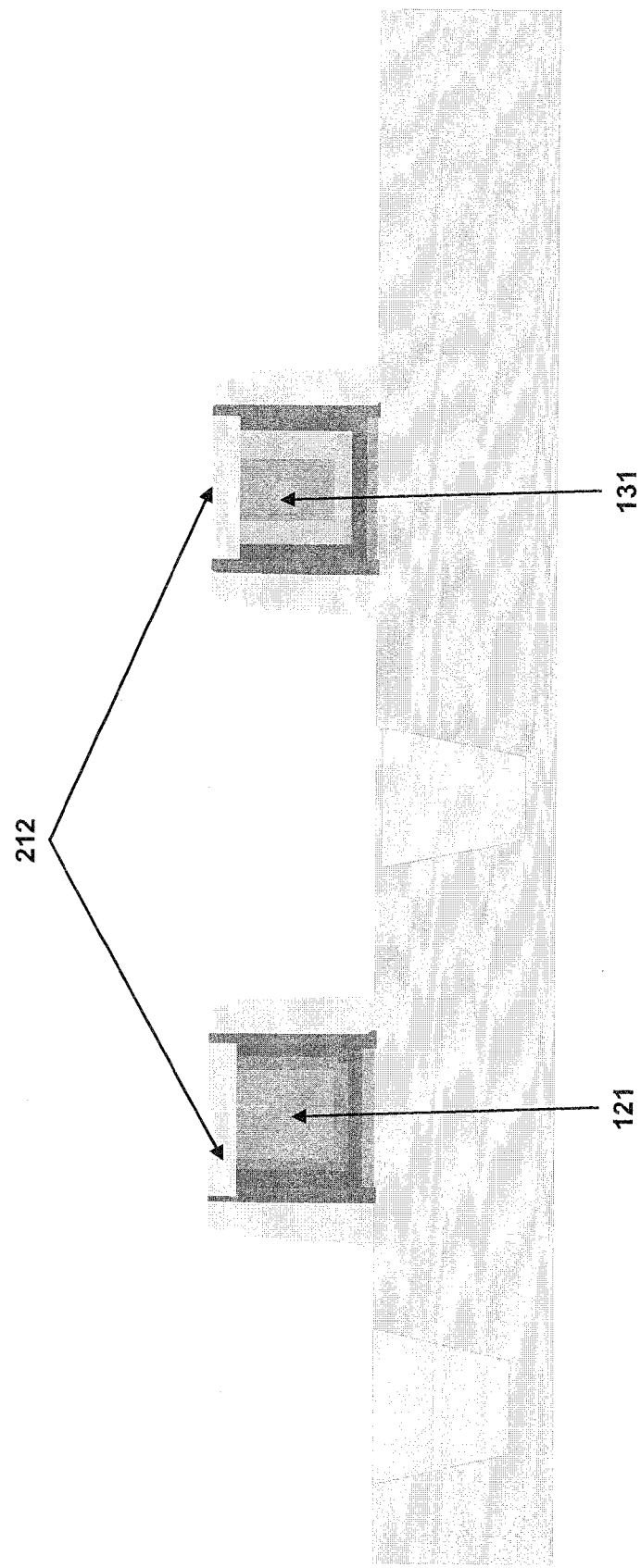

Referring to FIG. 13, the stress liner 160 and dielectric 170 are removed from the substrate 100 by an etching process, such as, for example, a wet etch process. Then, referring to FIG. 14, a second high-K dielectric layer 194 is deposited on the substrate 100 including the FETs 120, 130 and the resistor structure 140 to protect the resistor and the gates. The second high-K dielectric layer 194 may include, for example, hafnium silicate, zirconium silicate, hafnium dioxide and/or zirconium dioxide, and is deposited using, for example, chemical vapor deposition, atomic layer deposition or molecular layer deposition.

Figure 15:
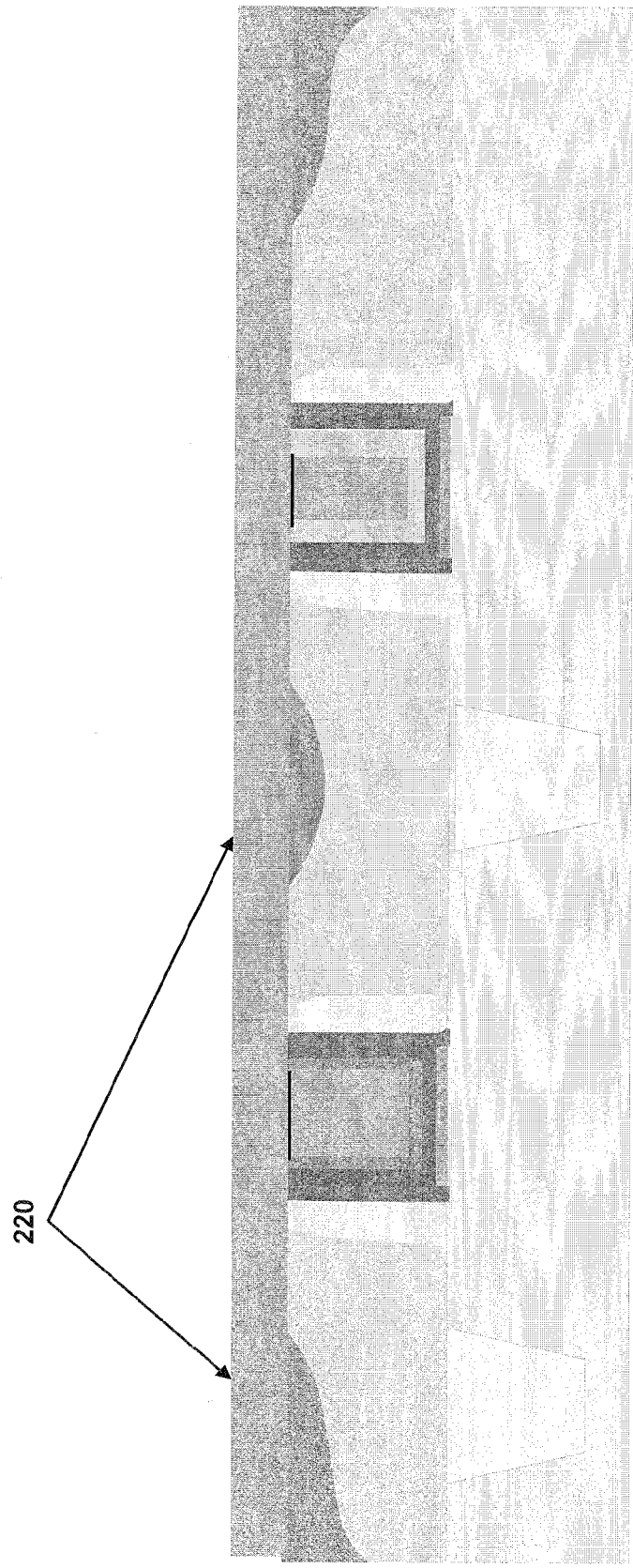

Referring to FIG. 15, according to an alternative embodiment, instead of forming the hard mask 210 as set forth in FIG. 9, a protective layer 220, such as, for example silicon nitride, is formed on the structure in FIG. 8. The protective layer 220 has a thickness, for example, in the range of about 50 angstroms to about 100 angstroms. If the protective layer 220 is too thick, this may result in unwanted delay of an analog signal.

Figure 16:
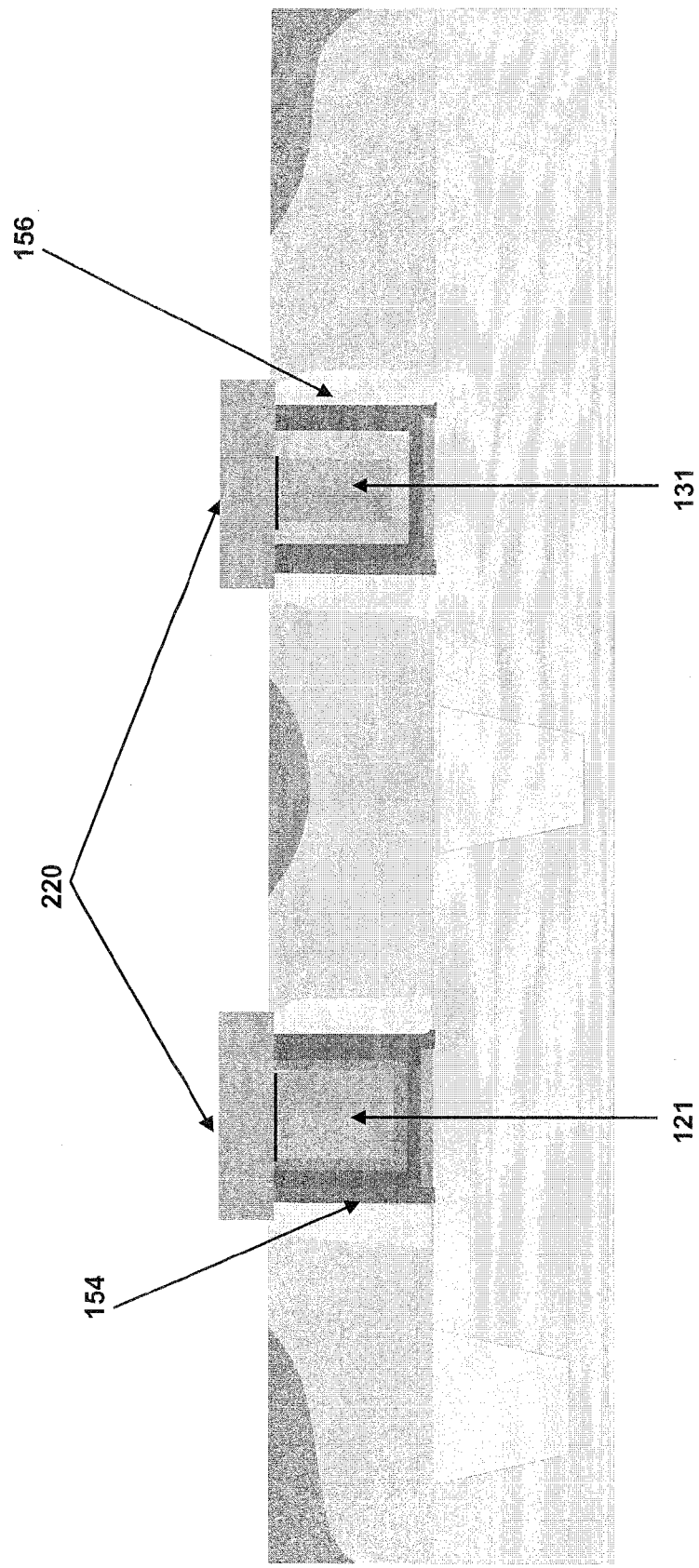

Referring to FIG. 16, the protective layer 220 is removed except for portions of the protective layer 220 covering the metal gates 121, 131, and the spacers 154, 156. As an alternative, the protective layer can also be removed from the areas covering the spacers 154, 156. The protective layer 220 is removed by a patterning process, such as etching.

Figure 17:
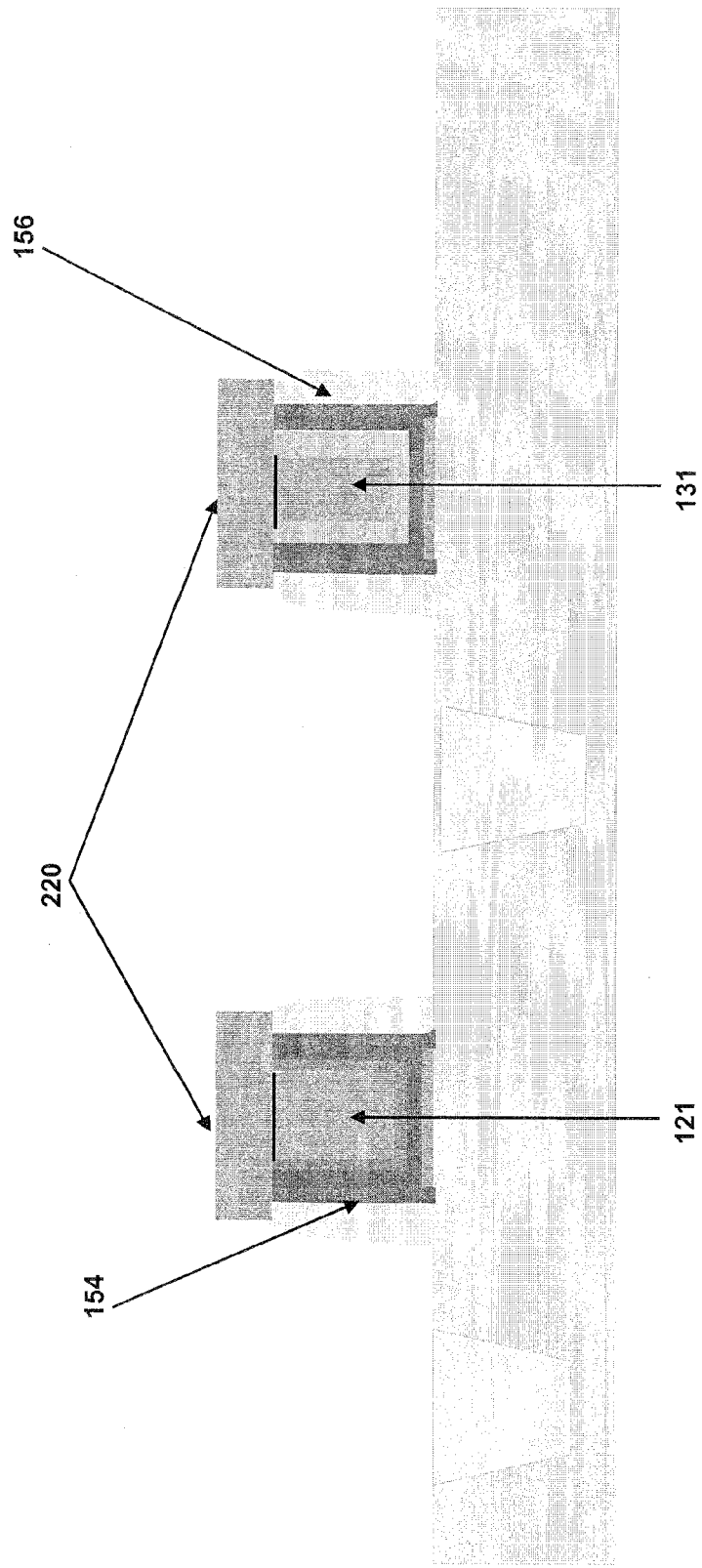

Referring to FIG. 17, similar to FIG. 13, the stress liner 160 and dielectric 170 are removed from the substrate 100 by an etching process, such as, for example, a wet etch process. Then, referring to FIG. 18, similar to FIG. 14, a second high-K dielectric layer 194 is deposited on the substrate 100.

Figure 14:
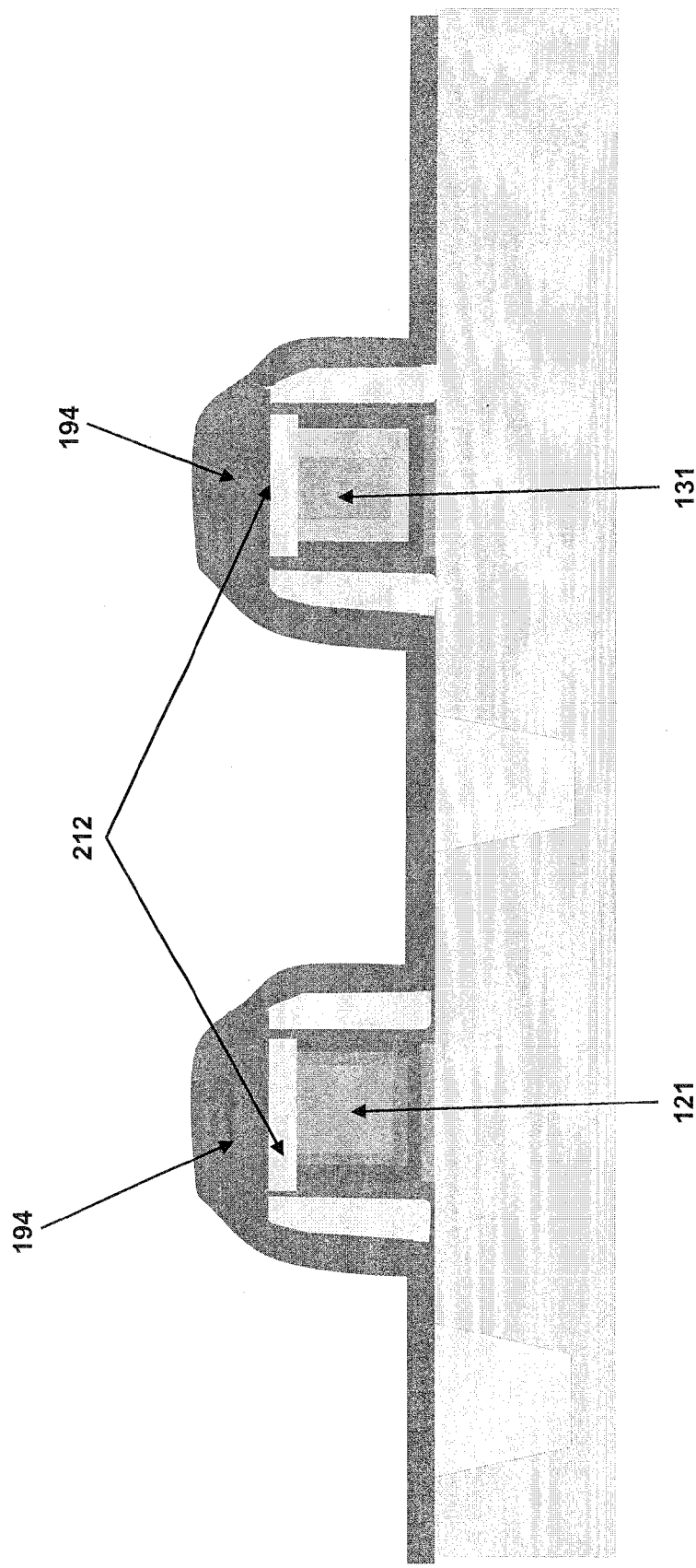
Figure 18:
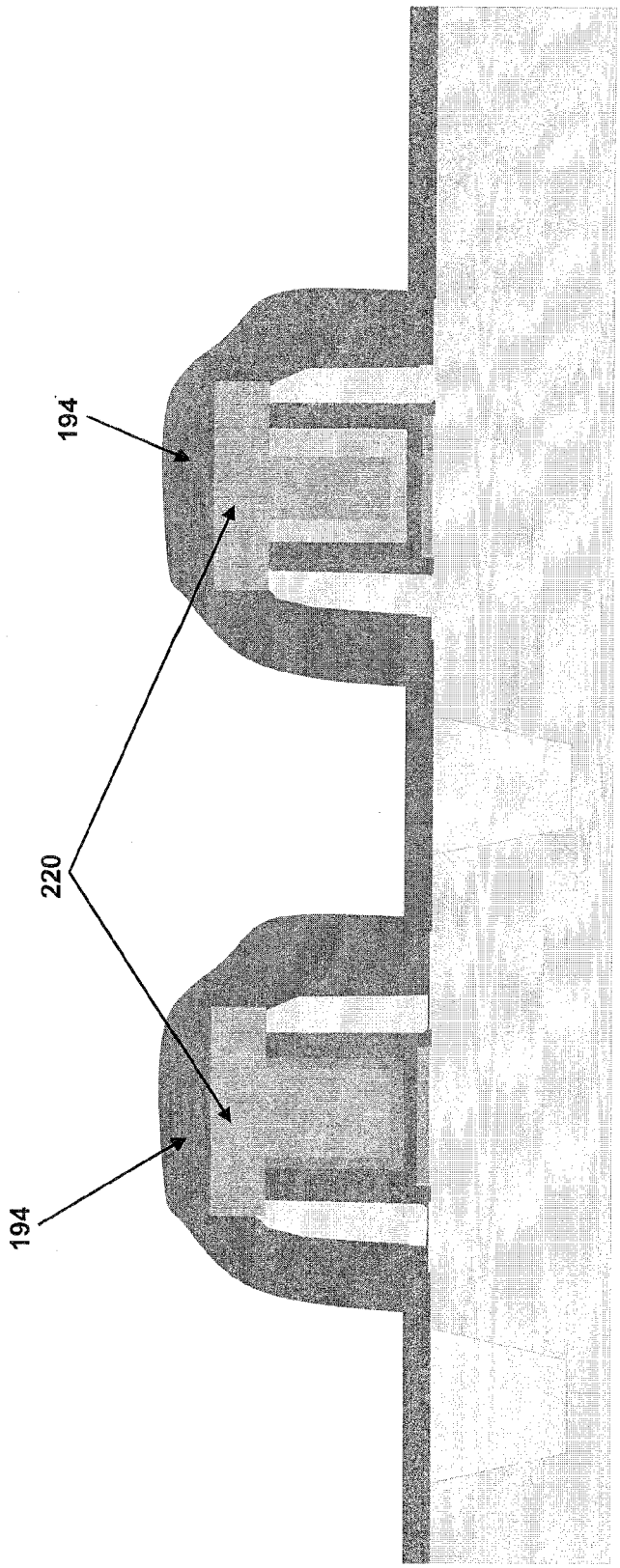
Figure 19A:
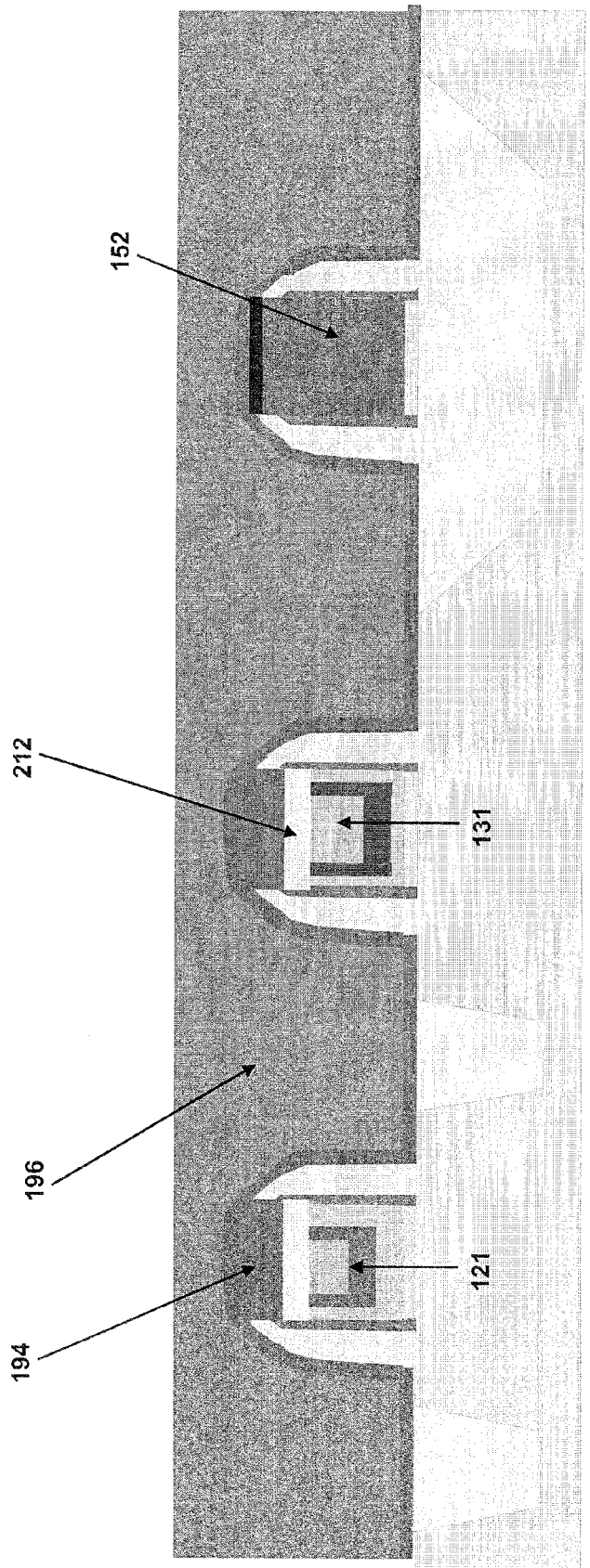
Figure 19B:
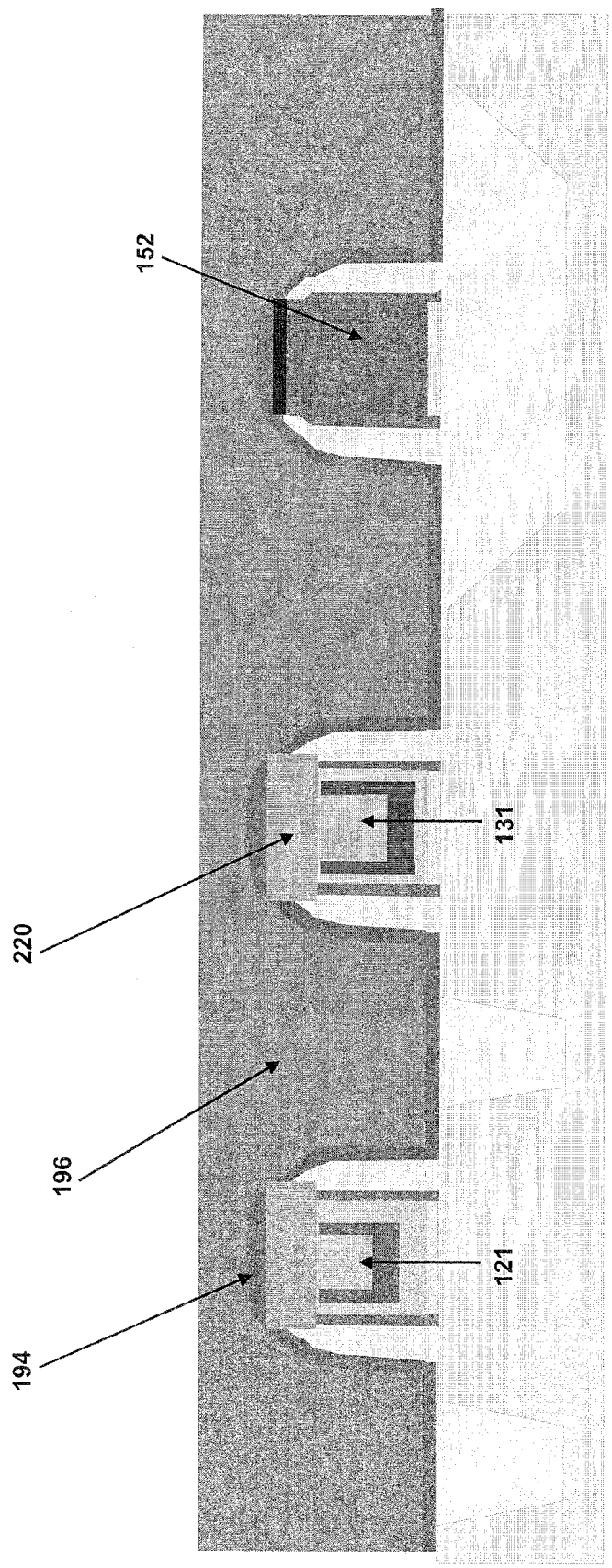

Referring to FIGS. 19A and 19B, a layer of silicon nitride (SiN) or silicon dioxide ($SiO_2$) 196 is deposited on the structure shown in FIG. 14 or 18 to result in the structures shown in FIGS. 19A and 19B. The layer 196 is deposited using, for example, chemical vapor deposition, atomic layer deposition or molecular layer deposition.

Figure 20A:
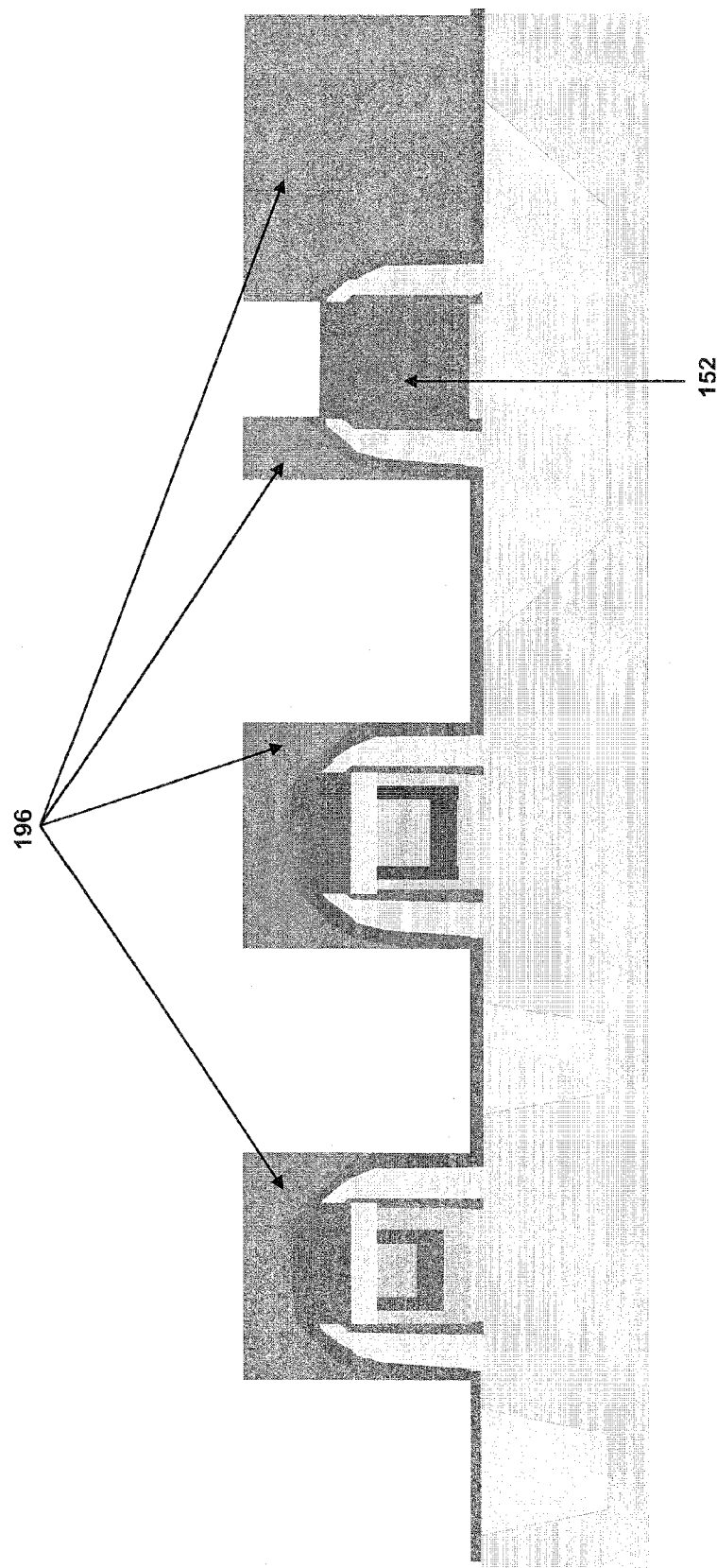
Figure 20B:
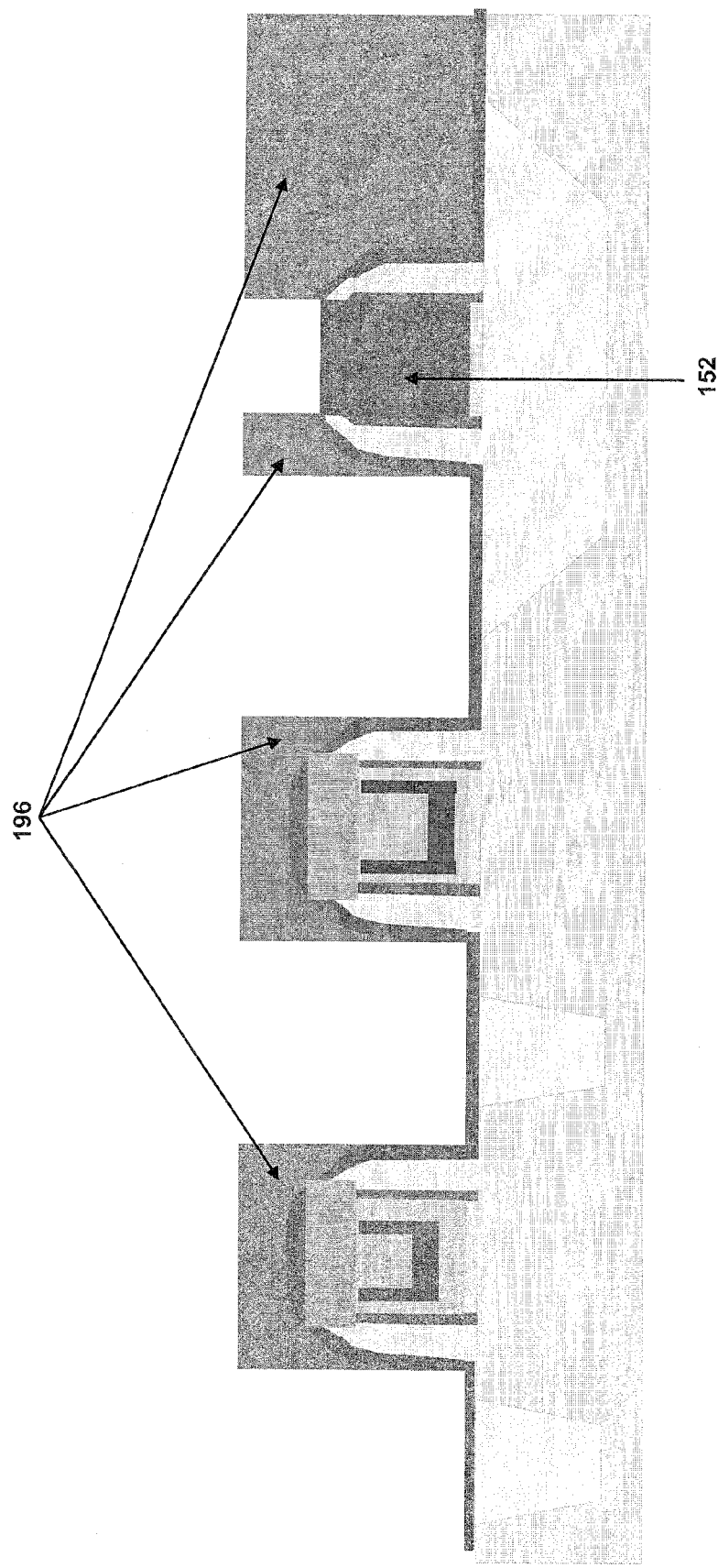

Referring to FIGS. 20A and 20B, using an open mask process, the layer 196 is removed from the areas between the gate and resistor stacks, and over the polysilicon 152 forming the resistor, as shown. The areas where the layer 196 is not removed are masked during the removal process. The removal of the layer 196 may be performed using, for example, a light or chemical etching process.

Figure 21A:
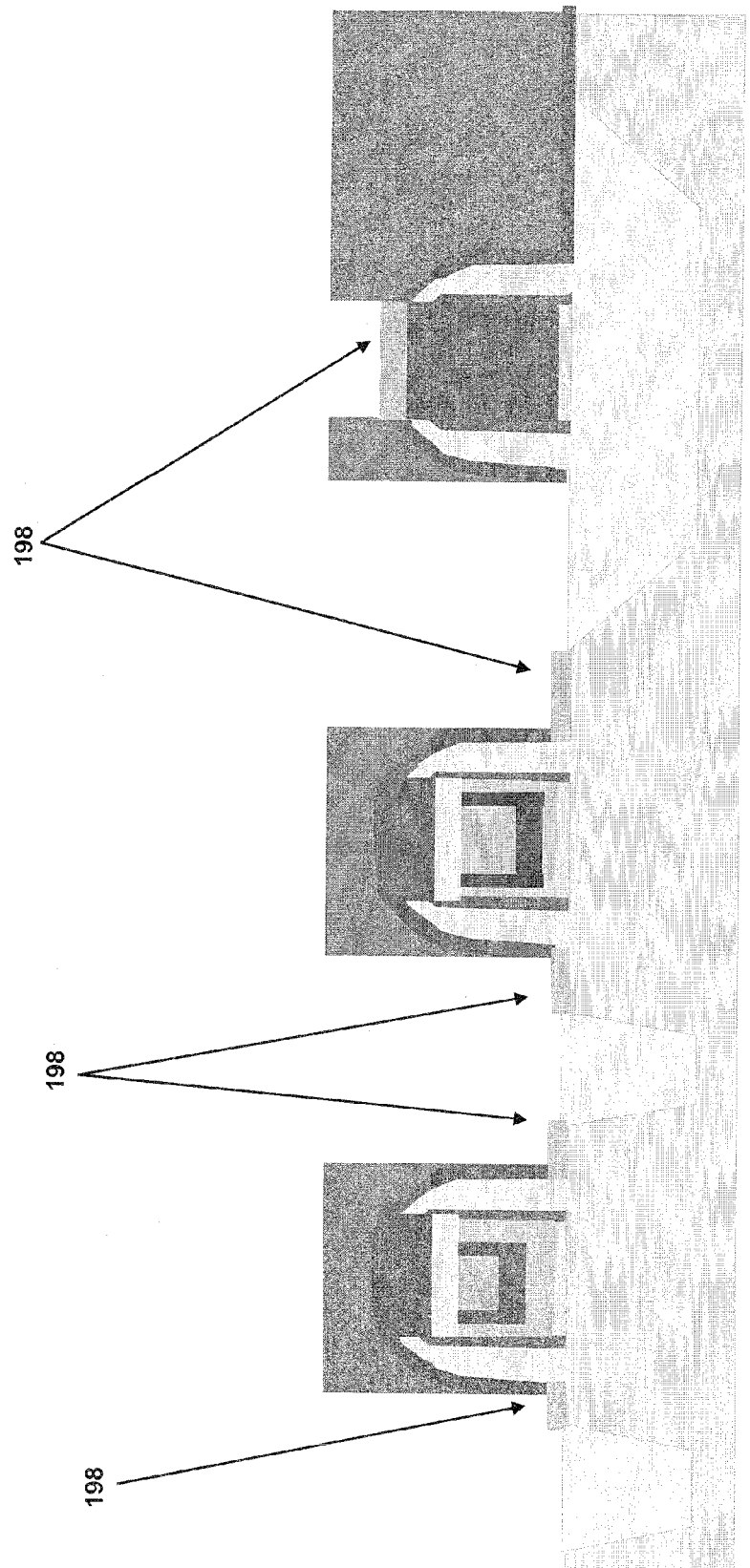

Referring to FIGS. 21A and 21B, silicide is formed on the structures shown in FIGS. 20A and 20B. The silicide can be, for example, nickel silicide (NiSi), but is not limited thereto. Other silicides, such as, for example, sodium silicide ($Na_2Si$), magnesium silicide ($Mg_2Si$), platinum silicide (PtSi), titantium silicide ($TiSi_2$), and tungsten silicide ($WSi_2$), can be used. For purposes of explanation, NiSi is described in connection with the instant embodiment. According to an embodiment, prior to depositing nickel (Ni) on the substrate, the substrate is pre-cleaned to remove oxides, such as the oxides forming the second high-K dielectric layer 194, from those portions of the substrate where the silicide is to be formed, for example, between the gate and resistor stacks. After pre-cleaning, Ni is deposited to react with the silicon in the designated areas, and form the silicide 198. After Ni deposition, annealing is performed, then unreacted Ni is removed, and annealing is again performed. The silicide 198 reduces sheet resistance.

Figure 22A:
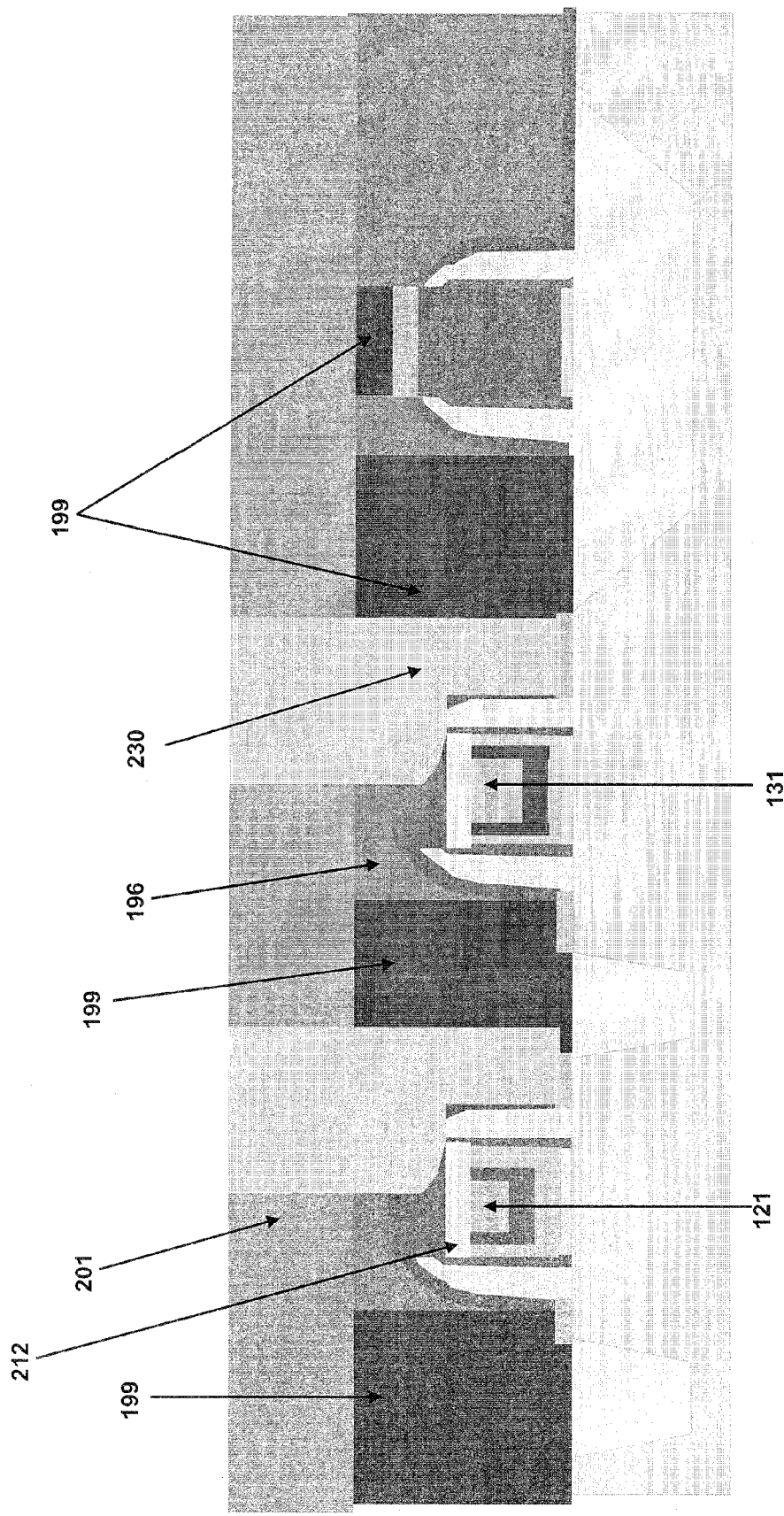
Figure 22B:
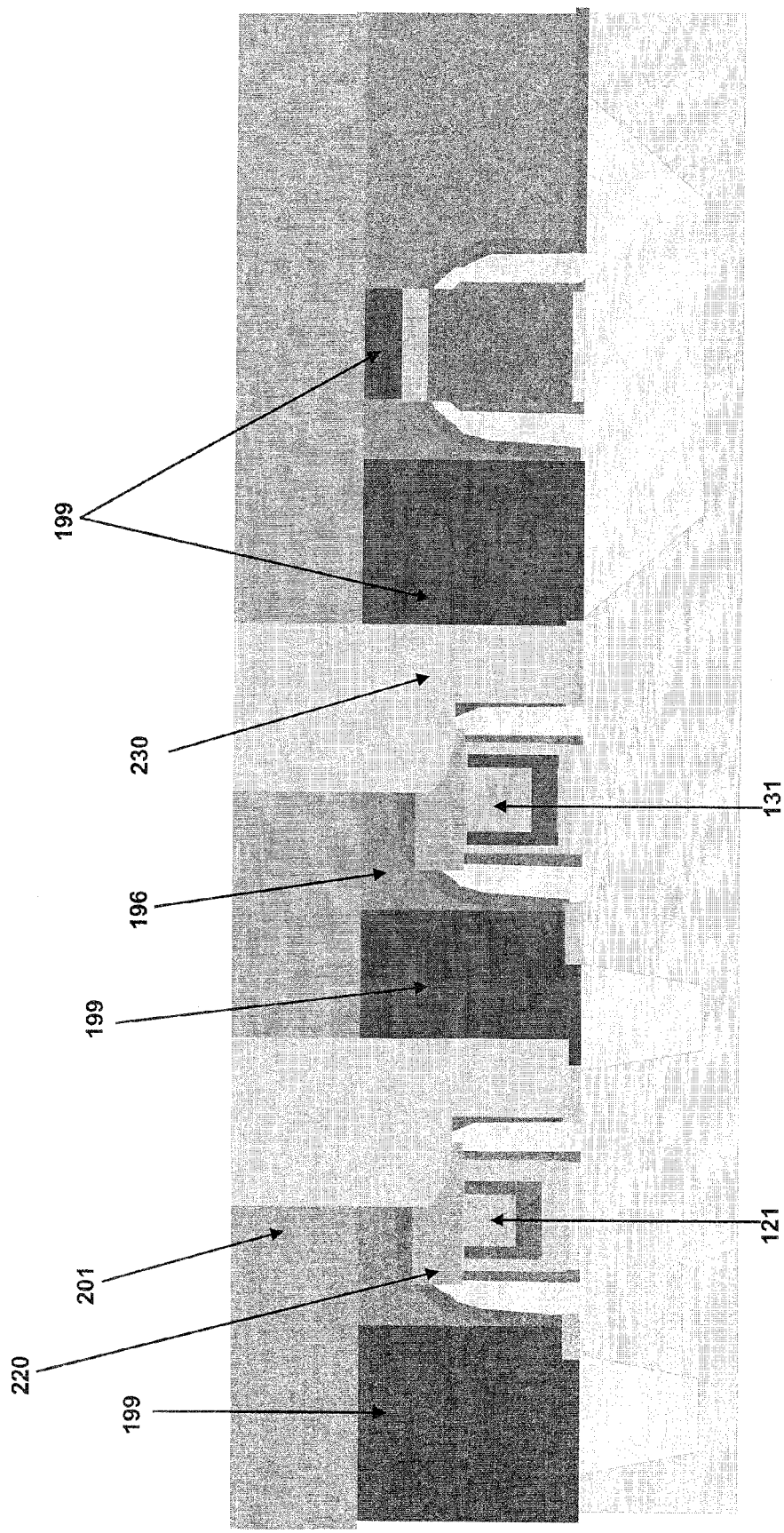

According to an embodiment, referring to FIGS. 22A and 22B, after silicide formation, a layer of silicon nitride (SiN) or silicon dioxide ($SiO_2$) 199, and a tetraethoxysilane (TEOS) or USG layer 201 can be deposited on the structure shown in FIGS. 21A and 21B. The SiN or $SiO_2$ and TEOS can be deposited using, for example, chemical vapor deposition, atomic layer deposition or molecular layer deposition. Thereafter CMP, etching and metal deposition can be performed to result in the structures shown in FIGS. 22A and 22B including the SACs 230 filled with the deposited metal, such as tungsten.

After etching, vias are filled with the metal to form the SACs 230. A portion of areas over the metal gates 121, 131 (exaggerated for illustration), where part of the layers 194 and/or 196 are inadvertently removed during etching, such as during a light process, also receive the deposited metal. The presence of the protective layers 212 or 220 between the metal and top surface of the metal gates 121, 131 prevents shorting between the gates 121, 131 and the SACs 230, since the SACs and the gates do not contact each other.

According to an embodiment, if the metal gates include multiple layers of different metals, such as is described in connection with FIG. 7, the protective layers 212 and 220 can be configured to cover the entire top surface of the metal gate, regardless whether the outer layers of the metal gates include different metals from the inner layers of the metal gates.

Figure 23:
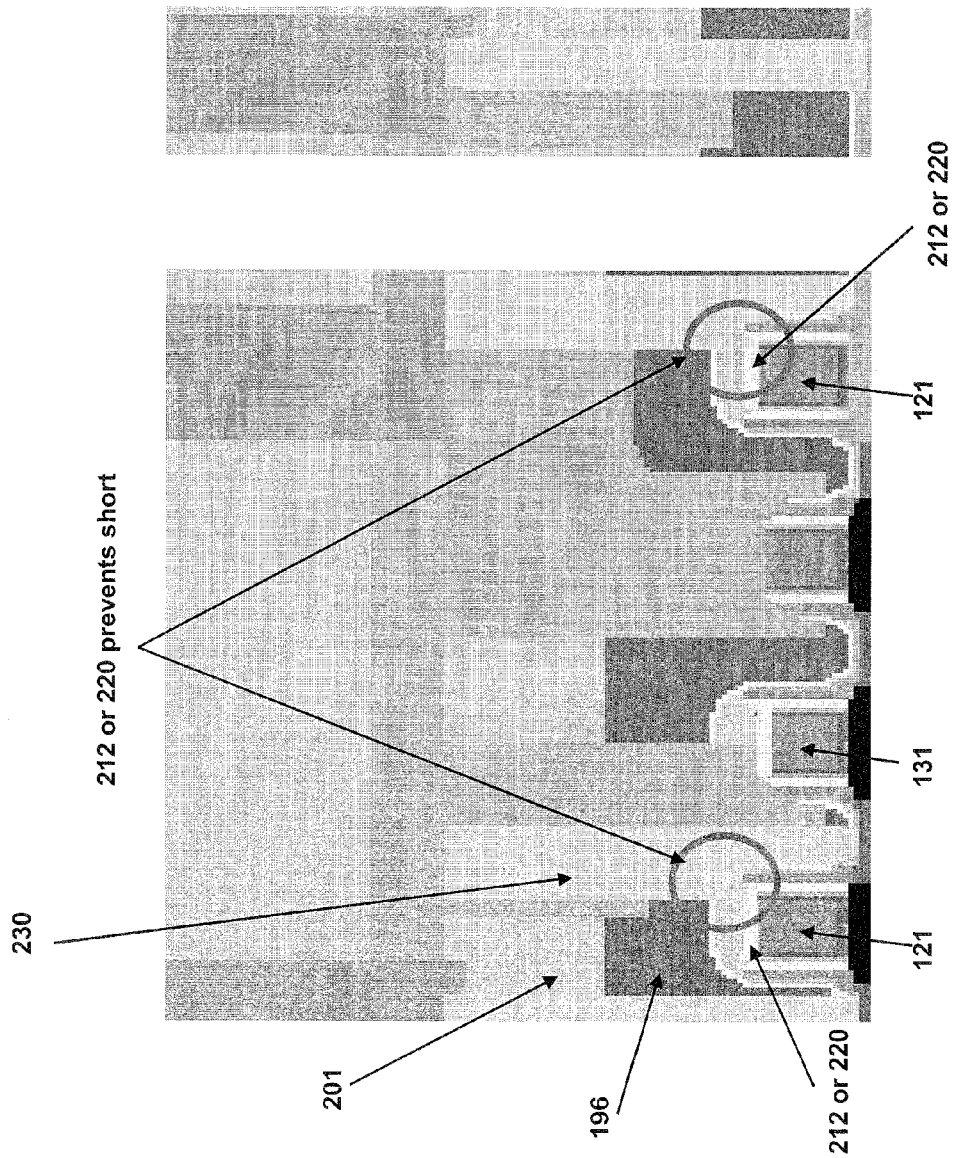

According to an embodiment, referring to FIG. 23, the SAC contact structure is formed, wherein the protective layers 212 or 220 block the SAC interconnects 230 from contacting the metal gates 121, 131, thereby preventing unwanted shorts between the gates and the interconnects.

Figure 24:
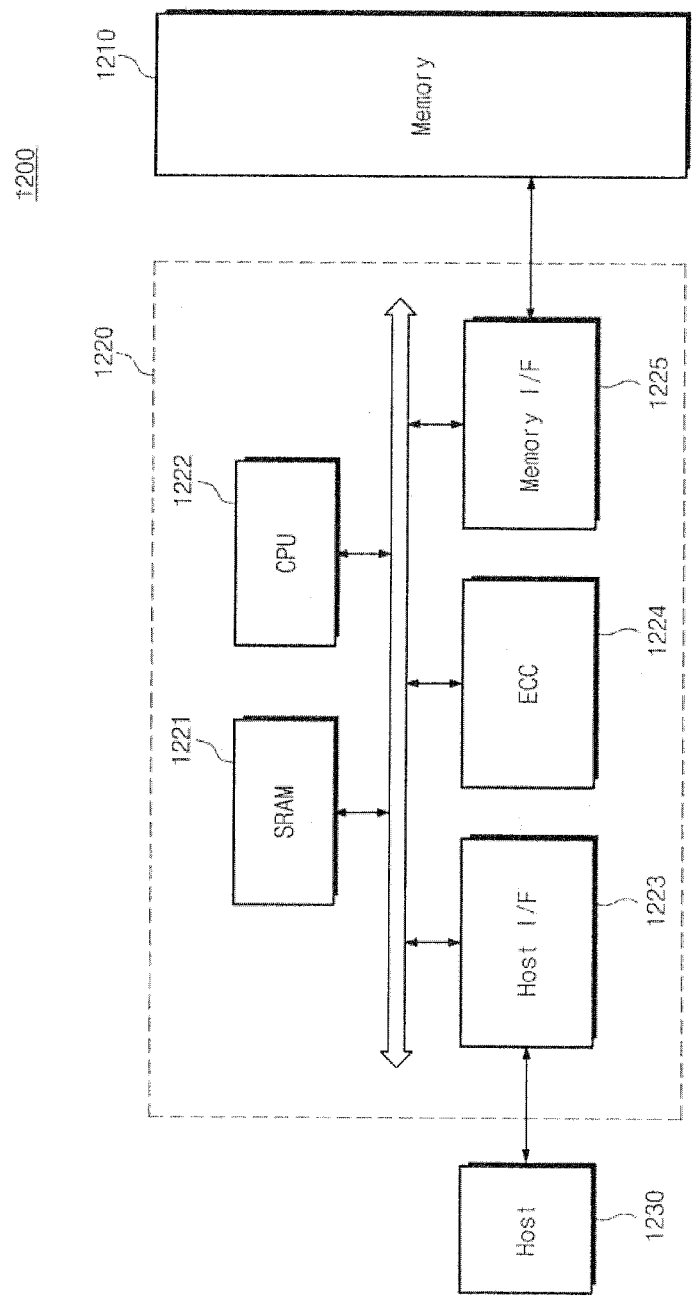
FIG. 24 is a block diagram of a memory card having a semiconductor device according to an embodiment of the present inventive concept.

FIG. 24 is a block diagram of a memory card having a semiconductor device according to an embodiment of the inventive concept.

Referring to FIG. 24, a semiconductor memory 1210 including semiconductor devices according to various embodiments of the inventive concept may be applicable to a memory card 1200. For example, the memory card 1200 includes a memory controller 1220 that controls data exchange between a host and the memory 1210. An SRAM 1221 may be used as a working memory of a central processing unit (CPU) 1222. A host interface (I/F) 1223 may have a data exchange protocol of the host connected to the memory card 1200. An error correction code (ECC) 1224 detects and corrects an error in data read from the memory 1210. A memory interface (I/F) 1225 interfaces with the memory 1210. The CPU 1222 performs an overall control operation for data exchange of the memory controller 1220.

Figure 25:
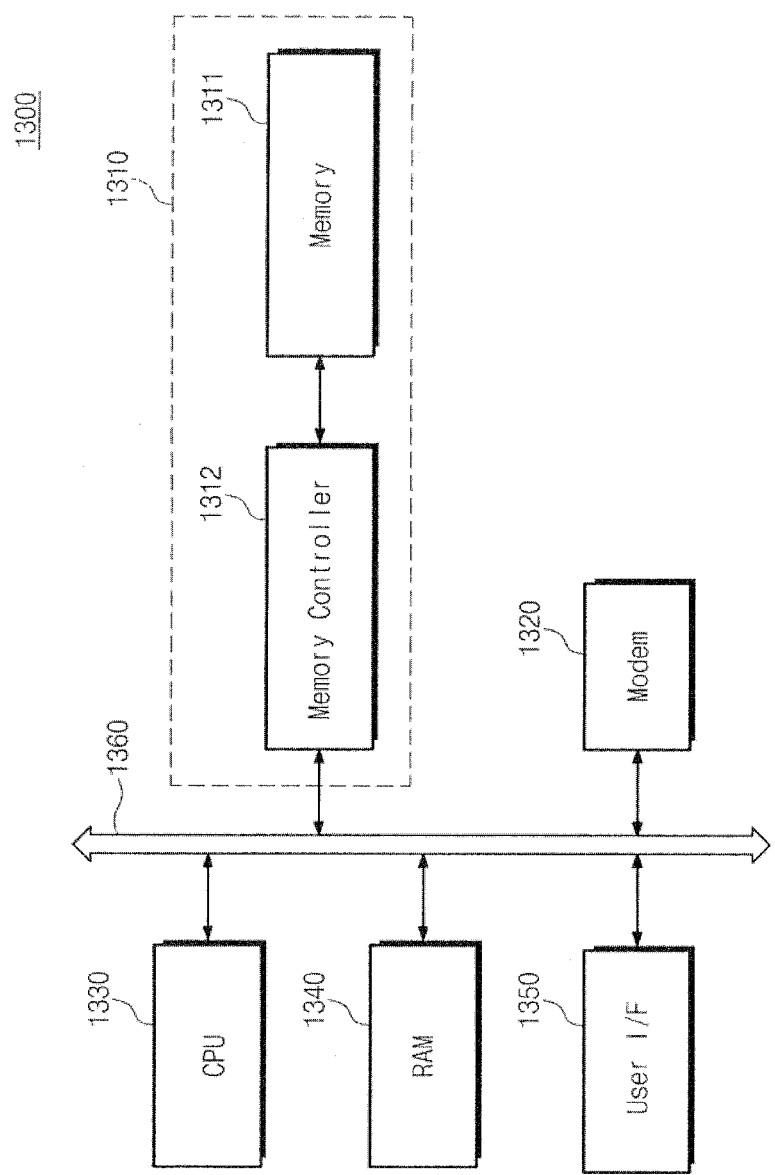
FIG. 25 is a block diagram of an information processing system using a semiconductor device according to an embodiment of the present inventive concept.

FIG. 25 is a block diagram of an information processing system using a semiconductor device according to an embodiment of the inventive concept.

Referring to FIG. 25, an information processing system 1300 may include a memory system 1310 having a semiconductor device according to an embodiment of the inventive concept. Examples of the information processing system 1300 include mobile devices and computers. For example, the information processing system 1300 includes a memory system 1310, a modem 1320, a central processing unit (CPU) 1330, a RAM 1340, and a user interface 1350 that are electrically connected to a system bus 1360. The memory system 1310 may include a memory 1311 and a memory controller 1312 and may have substantially the same configuration as the memory card 1200 of FIG. 24. Data processed by the CPU 1330 or data received from an external device may be stored in the memory system 1310. The information processing system 1300 may be provided for memory cards, solid state disks, camera image sensors, and other application chipsets. For example, the memory system 1310 may be configured using a solid state disk (SSD). In this case, the information processing system 1300 can store a large amount of data in the memory system 1310 stably and reliably.

Figure 26:
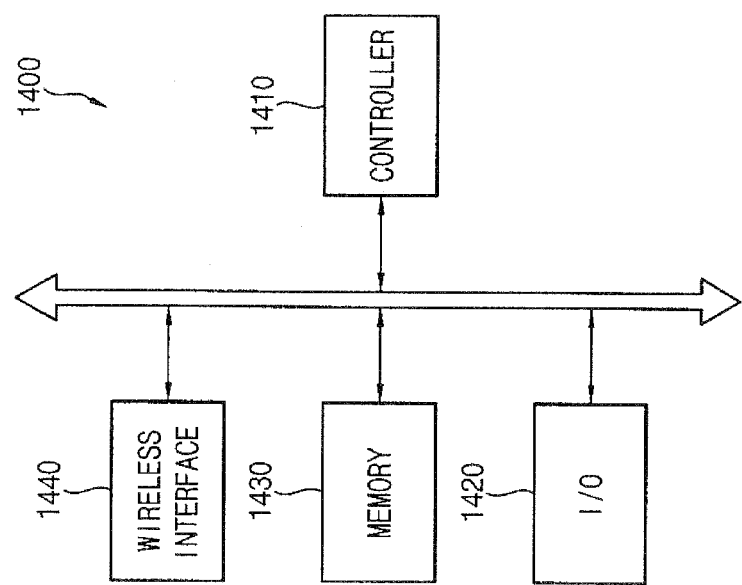
FIG. 26 is a block diagram of an electronic device including a semiconductor device according to exemplary embodiments of the present inventive concept.

Referring to FIG. 26, an electronic device including a semiconductor device according to exemplary embodiments of the present inventive concept will be described. The electronic device 1400 may be used in a wireless communication device (e.g., a personal digital assistant, a laptop computer, a portable computer, a web tablet, a wireless telephone, a mobile phone and/or a wireless digital music player) or in any device capable of transmitting and/or receiving information via wireless environments.

The electronic device 1400 includes a controller 1410, an input/output (I/O) device 1420 (e.g., a keypad, a keyboard, and a display), a memory 1430 having a semiconductor device according to at least one embodiment of the present inventive concept, and a wireless interface 1440. The controller 1410 may include at least one of a microprocessor, a digital signal processor, or a similar processing device. The memory 1430 may be used to store commands executed by the controller 1410, for example. The memory 1430 may be used to store user data. The memory 1430 includes a semiconductor device according to at least one embodiment of the present inventive concept. The electronic device 1400 may utilize the wireless interface 1440 to transmit/receive data via a wireless communication network. For example, the wireless interface 1440 may include an antenna and/or a wireless transceiver. The electronic device 1400 according to exemplary embodiments may be used in a communication interface protocol of a third generation communication system, e.g., code division multiple access (CDMA), global system for mobile communications (GSM), north American digital cellular (NADC), extended-time division multiple access (E-TDMA) and/or wide band code division multiple access (WCDMA), CDMA2000.

Although exemplary embodiments of the present inventive concept have been described hereinabove, it should be understood that the present inventive concept is not limited to these embodiments, but may be modified by those skilled in the art without departing from the spirit and scope of the present inventive concept.

What is claimed is:
1. A method for manufacturing a semiconductor device, comprising:
forming a metal gate of a transistor on a substrate by a replacement metal gate process, wherein an insulating layer is formed on the substrate adjacent the metal gate;
forming a hard mask on the substrate including the insulating layer and the metal gate, the hard mask including an opening exposing the metal gate;

performing a metal pull back process on the substrate to remove a predetermined depth of a top portion of the metal gate;

depositing a protective layer on the substrate, the hard mask and top of a remaining portion of the metal gate; and performing chemical mechanical polishing to remove the hard mask and the protective layer, wherein the protective layer formed on top of the remaining portion of the metal gate remains.

2. The method for manufacturing the semiconductor device according to claim 1, wherein the predetermined depth is approximately 100 angstroms.

3. The method for manufacturing the semiconductor device according to claim 1, wherein the protective layer includes silicon nitride.

4. The method for manufacturing the semiconductor device according to claim 1, further comprising removing the insulating layer.

5. The method for manufacturing the semiconductor device according to claim 1, wherein a chemical mechanical polishing process is performed on the insulating layer and the metal gate prior to forming the hard mask.

6. The method for manufacturing the semiconductor device according to claim 1, wherein the metal gate includes an outer layer comprising a different metal than that of an inner layer, the protective layer covering each of the inner and outer layers.

7. A computer system comprising a semiconductor device having a circuit layout manufactured by the method of claim 1, wherein the computer system is one of a personal computer (PC), a personal digital assistant (PDA), an MP3 player, a digital audio recorder, a pen-shaped computer, a digital camera, or a video recorder.

8. A system for transmitting or receiving data, the system comprising:

a memory device for storing a program; and a processor in communication with the memory device, wherein the memory device comprises a circuit layout manufactured by the method of claim 1.

9. A semiconductor memory card, comprising:

an interface part that interfaces with an external device;

a controller that communicates with the interface part and a memory device via address and data buses, wherein the memory device comprises a circuit layout manufactured by the method of claim 1.

10. The method for manufacturing the semiconductor device according to claim 4, further comprising depositing a first dielectric layer on exposed portions of the substrate, including the protective layer formed on top of the remaining portion of the metal gate.

11. The method for manufacturing the semiconductor device according to claim 10, further comprising:

depositing a second dielectric layer on the structure including the first dielectric layer;

performing an open mask process to remove the first and second dielectric layers from areas adjacent the metal gate; and forming a silicide layer on portions of the substrate where the first and second dielectric layers were removed.

12. The method for manufacturing the semiconductor device according to claim 11, further comprising:

depositing a third dielectric layer on the metal gate and on the silicide layer;

etching the third dielectric layer disposed over the silicide layer to form a via; and filling the via with a metal to form an interconnect, wherein a portion of the metal fills vacant area on the protective layer, disposing the protective layer between the metal gate and the metal in the via, the protective layer blocking the metal in the via from contacting the metal gate.

13. The method for manufacturing the semiconductor device according to claim 12, wherein the metal filling the via comprises tungsten.

14. The method for manufacturing the semiconductor device according to claim 12, wherein the third dielectric layer comprises at least one of tetraethoxysilane (TEOS) and undoped silicate glass (USG).

15. The system according to claim 8, wherein the system comprises at least one of a mobile system, a portable computer, a web tablet, a mobile phone, a digital music player, or a memory card.

16. A method for manufacturing a semiconductor device, comprising;

forming a metal gate of a transistor on a substrate by a replacement metal gate process, wherein an insulating layer is formed on the substrate adjacent the metal gate;

depositing a protective layer on the substrate covering the insulating layer and a top surface of the metal gate;

patterning the protective layer to remove the protective layer from the insulating layer adjacent the metal gate, wherein the protective layer remains covering the top surface of the metal gate;

removing the insulating layer to expose the substrate adjacent the metal gate; and after removing the insulating layer, depositing a first dielectric layer on the exposed substrate and the protective layer covering the top surface of the metal gate.

17. The method for manufacturing the semiconductor device according to claim 16, wherein a thickness of the protective layer is about 50 angstroms to about 100 angstroms.

18. The method for manufacturing the semiconductor device according to claim 16, wherein the protective layer includes silicon nitride.

19. The method for manufacturing the semiconductor device according to claim 16, further comprising:

depositing a second dielectric layer on the structure including the first dielectric layer;

performing an open mask process to remove the first and second dielectric layers from areas adjacent the metal gate; and forming a silicide layer on portions of the substrate where the first and second dielectric layers were removed.

20. The method for manufacturing the semiconductor device according to claim 16, wherein a chemical mechanical polishing process is performed on the insulating layer and the metal gate prior to depositing the protective layer.

21. The method for manufacturing the semiconductor device according to claim 16, wherein the metal gate includes an outer layer comprising a different metal than that of an inner layer, the protective layer covering each of the inner and outer layers.

22. The method for manufacturing the semiconductor device according to claim 19, further comprising:

depositing a third dielectric layer on the metal gate and on the silicide layer;

etching the third dielectric layer disposed over the silicide layer to form a via; and filling the via with a metal to form an interconnect, wherein a portion of the metal fills a vacant area on the protective layer, disposing the protective layer between the metal gate and the metal in the via, the protective layer blocking the metal in the via from contacting the metal gate.

23. The method for manufacturing the semiconductor device according to claim 22, wherein the metal filling the via comprises tungsten.

24. The method for manufacturing the semiconductor device according to claim 22, wherein the third dielectric layer comprises at least one of tetraethoxysilane (TEOS) and undoped silicate glass (USG).

* * * * *